(12) United States Patent
Matsuda et al.

(10) Patent No.: US 8,980,529 B2
(45) Date of Patent: Mar. 17, 2015

(54) RADIATION-SENSITIVE RESIN COMPOSITION, POLYMER, AND RESIST PATTERN-FORMING METHOD

(71) Applicant: JSR Corporation, Tokyo (JP)

(72) Inventors: Yasuhiko Matsuda, Tokyo (JP); Norihiko Sugie, Tokyo (JP); Tomohiro Kakizawa, Tokyo (JP); Takakazu Kimoto, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/830,880

(22) Filed: Mar. 14, 2013

(65) Prior Publication Data

US 2013/0203000 A1 Aug. 8, 2013

Related U.S. Application Data

(63) Continuation of application No. PCT/JP2011/071163, filed on Sep. 15, 2011.

(30) Foreign Application Priority Data

Sep. 17, 2010 (JP) ................................. 2010-208778

(51) Int. Cl.
*G03F 7/004* (2006.01)
*C08F 220/30* (2006.01)
*C08F 224/00* (2006.01)
*G03F 7/039* (2006.01)
*G03F 7/20* (2006.01)

(52) U.S. Cl.
CPC .............. *G03F 7/004* (2013.01); *C08F 220/30* (2013.01); *C08F 224/00* (2013.01); *G03F 7/0046* (2013.01); *G03F 7/0397* (2013.01); *G03F 7/2041* (2013.01); *Y10S 430/114* (2013.01)
USPC ........................................ 430/270.1; 430/913

(58) Field of Classification Search
USPC .................................................. 430/270, 913
See application file for complete search history.

(56) References Cited

U.S. PATENT DOCUMENTS

| | | | | |
|---|---|---|---|---|
| 5,910,392 | A * | 6/1999 | Nozaki et al. ............... | 430/270.1 |
| 6,927,009 | B2 * | 8/2005 | Kodama et al. ............. | 430/270.1 |
| 7,141,352 | B2 * | 11/2006 | Watanabe et al. ........... | 430/270.1 |
| 7,252,924 | B2 * | 8/2007 | Yamanaka et al. .......... | 430/270.1 |
| 7,261,995 | B2 * | 8/2007 | Watanabe et al. ........... | 430/270.1 |
| 7,648,817 | B2 * | 1/2010 | Kato et al. .................. | 430/270.1 |
| 7,838,198 | B2 * | 11/2010 | Chen et al. .................. | 430/270.1 |
| 7,838,200 | B2 * | 11/2010 | Chen et al. .................. | 430/270.1 |
| 7,955,780 | B2 * | 6/2011 | Kato et al. .................. | 430/270.1 |
| 8,029,972 | B2 * | 10/2011 | Nakamura et al. .......... | 430/270.1 |
| 8,053,161 | B2 * | 11/2011 | Wada et al. ................. | 430/270.1 |

(Continued)

FOREIGN PATENT DOCUMENTS

| | | |
|---|---|---|
| JP | 06-012452 B2 | 5/1984 |
| JP | 05-188598 | 7/1993 |
| JP | 09-073173 | 3/1997 |
| JP | 2002-372784 | 12/2002 |
| JP | 2003-084438 | 3/2003 |

(Continued)

OTHER PUBLICATIONS

International Search Report for corresponding International Application No. PCT/JP2011/071163, Oct. 11, 2011.
Office Action issued Nov. 4, 2014, in Japanese Patent Application No. 2012-534056 (w/ English-language translation).

*Primary Examiner* — Amanda C. Walke
(74) *Attorney, Agent, or Firm* — Oblon, McClelland, Maier & Neustadt, L.L.P.

(57) ABSTRACT

A radiation-sensitive resin composition includes a polymer component, a radiation-sensitive acid generating agent, and a nitrogen-containing compound having a ring structure. The polymer component includes, in an identical polymer or different polymers, a first structural unit represented by a formula (1) and a second structural unit represented by a formula (2). $R^1$ represents a hydrogen atom or a methyl group. Z is a group which represents a divalent monocyclic alicyclic hydrocarbon group taken together with $R^2$. $R^2$ represents a carbon atom. $R^3$ represents a methyl group or an ethyl group. $R^4$ represents a hydrogen atom or a methyl group. X is a group which represents a divalent bridged alicyclic hydrocarbon group having no less than 10 carbon atoms taken together with $R^5$. $R^5$ represents a carbon atom. $R^6$ represents a branched alkyl group having 3 or 4 carbon atoms.

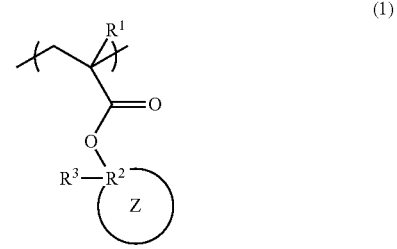

(1)

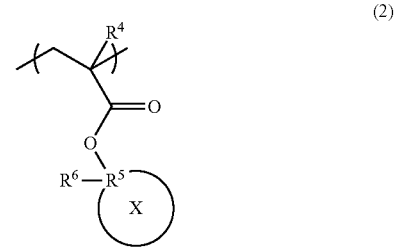

(2)

9 Claims, No Drawings

(56) References Cited

U.S. PATENT DOCUMENTS

| | | | |
|---|---|---|---|
| 8,124,314 B2 * | 2/2012 | Nishimura et al. | 430/270.1 |
| 8,192,914 B2 * | 6/2012 | Irie | 430/270.1 |
| 8,476,444 B2 * | 7/2013 | Katayama et al. | 546/226 |
| 8,592,133 B2 * | 11/2013 | Watanabe et al. | 430/270.1 |
| 8,597,867 B2 * | 12/2013 | Nakashima et al. | 430/270.1 |
| 8,609,319 B2 * | 12/2013 | Kimura et al. | 430/270.1 |
| 8,617,788 B2 * | 12/2013 | Kato et al. | 430/270.1 |
| 8,647,812 B2 * | 2/2014 | Fujii et al. | 430/270.1 |
| 8,703,384 B2 * | 4/2014 | Kobayashi et al. | 430/270.1 |
| 2010/0028804 A1 * | 2/2010 | Iwato et al. | 430/270.1 |
| 2010/0203451 A1 * | 8/2010 | Kato et al. | 430/285.1 |
| 2010/0239981 A1 * | 9/2010 | Ikeda et al. | 430/286.1 |
| 2010/0285405 A1 * | 11/2010 | Shimokawa et al. | 430/270.1 |
| 2011/0223537 A1 * | 9/2011 | Ebata et al. | 430/270.1 |
| 2011/0269072 A1 * | 11/2011 | Shibuya | 430/270.1 |
| 2012/0070787 A1 * | 3/2012 | Huang et al. | 430/325 |
| 2012/0164528 A1 * | 6/2012 | Xu et al. | 429/211 |
| 2013/0056654 A1 * | 3/2013 | Hatakeyama et al. | 250/492.3 |
| 2013/0089817 A1 * | 4/2013 | Miyata et al. | 430/270.1 |
| 2013/0143160 A1 * | 6/2013 | Asano et al. | 430/285.1 |
| 2013/0224666 A1 * | 8/2013 | Sakakibara et al. | 430/325 |

FOREIGN PATENT DOCUMENTS

| | | |
|---|---|---|
| JP | 2005-023092 | 1/2005 |
| JP | 2005-126706 | 5/2005 |
| JP | 2008-308545 | 12/2008 |
| JP | 2008-308546 | 12/2008 |
| JP | 2009-080161 | 4/2009 |
| JP | 2010-191014 | 9/2010 |
| JP | 2011-006400 | 1/2011 |
| JP | 2011-053363 A | 3/2011 |
| JP | 2011-102380 A | 5/2011 |
| JP | 2011-191727 A | 9/2011 |
| WO | WO 2010/029965 | 3/2010 |

* cited by examiner

RADIATION-SENSITIVE RESIN COMPOSITION, POLYMER, AND RESIST PATTERN-FORMING METHOD

CROSS-REFERENCE TO RELATED APPLICATIONS

The present application is a continuation application of International Application No. PCT/JP2011/071163, filed Sep. 15, 2011, which claims priority to Japanese Patent Application No. 2010-208778, filed Sep. 17, 2010. The contents of these applications are incorporated herein by reference in their entirety.

BACKGROUND OF THE INVENTION

1. Field of the Invention

The present invention relates to a radiation-sensitive resin composition, a polymer, and a resist pattern-forming method.

2. Discussion of the Background

Chemically amplified radiation-sensitive resin compositions generate an acid upon irradiation with an electron beam or far ultraviolet ray typified by a KrF excimer laser or ArF excimer laser at a light-exposed site, and a chemical reaction that proceeds with an aid of the acid as a catalyst allows the difference in dissolution rates in developing solutions to be produced between the light-exposed site and the light-unexposed site, thereby enabling resist patterns to be formed on the substrate.

Of these radiation-sensitive resin compositions, as lithography materials for an ArF excimer laser as a light source that enable microfabrication with light at shorter wavelengths, a resin composition containing as a constitutional component a polymer having in the skeleton an alicyclic hydrocarbon that does not exhibit significant absorption in the area of 193 nm and provide high etching resistance has been used. Furthermore, positive type radiation-sensitive resin compositions typically contain a polymer which generates a polar group through the elimination of a protecting group by the action of an acid to render the polymer itself alkali-soluble, and specific alicyclic hydrocarbon groups have been proposed as the protecting group (see Japanese Unexamined Patent Application, Publication No. H9-73173). Moreover, a technique has been investigated for reducing LWR (line width roughness) of a line-and-space pattern by employing a protecting group of a specific structure (see Japanese Unexamined Patent Application, Publication Nos. 2008-308545 and 2008-308546). Furthermore, a technique is also known for improving resolution as well as coarseness and fineness dependence by combining specific protecting groups (see Japanese Unexamined Patent Application, Publication Nos. 2002-372784 and 2003-84438).

However, at present, microfabrication of resist patterns has reached the level of a line width of no greater than 90 nm, and not only the improvement of basic properties such as the improvement of the resolving ability and the lowering of the LWR as mentioned above, but also other additional performance have come to be required. For example, in a resist pattern, as a line width of the resist pattern becomes narrower, the aspect ratio of the resist pattern becomes larger, and the resist pattern, in turn, is more prone to collapse. Therefore, it is more strongly required that a limit dimension for pattern collapse, which is a limit value for causing the resist pattern not to collapse, is low. On the other hand, in the formation of the resist pattern, reduction of a film thickness of the resist coating film typically occurs after development. If an amount of residual resist film is low at this stage, a disadvantage likely to be raised that the resist pattern are incapable of sufficiently serving as a mask in an etching step, leading to unsatisfactory etching. In particular, these days when further thinning of resist coating films is advancing, the influence of the reduction of the amount of residual resist film becomes increasingly more significant. Thus, there is a need for a radiation-sensitive resin composition exhibiting excellent LWR feature, as well as a low limit dimension for pattern collapse, and a large amount of residual resist film.

SUMMARY OF THE INVENTION

According to one aspect of the present invention, a radiation-sensitive resin composition includes a polymer component, a radiation-sensitive acid generating agent, and a nitrogen-containing compound having a ring structure. The polymer component includes, in an identical polymer or different polymers, a first structural unit represented by a formula (1) and a second structural unit represented by a formula (2).

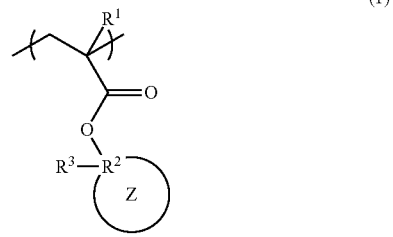

(1)

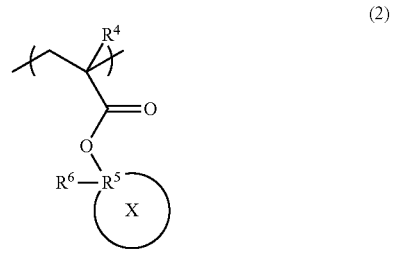

(2)

In the formula (1), $R^1$ represents a hydrogen atom or a methyl group. Z is a group which represents a divalent monocyclic alicyclic hydrocarbon group taken together with $R^2$. $R^2$ represents a carbon atom. $R^3$ represents a methyl group or an ethyl group. In the formula (2), $R^4$ represents a hydrogen atom or a methyl group. X is a group which represents a divalent bridged alicyclic hydrocarbon group having no less than 10 carbon atoms taken together with $R^5$. $R^5$ represents a carbon atom. $R^6$ represents a branched alkyl group having 3 or 4 carbon atoms.

According to another aspect of the present invention, a polymer includes a first structural unit represented a formula (1), a second structural unit represented a formula (2) and a structural unit including a cyclic carbonate structure.

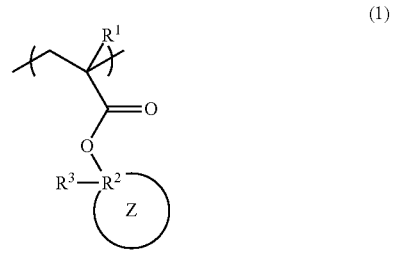

(1)

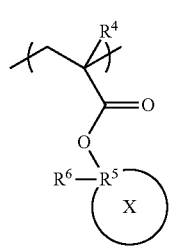

(2)

In the formula (1), $R^1$ represents a hydrogen atom or a methyl group. Z is a group which represents a divalent monocyclic alicyclic hydrocarbon group taken together with $R^2$. $R^2$ represents a carbon atom. $R^3$ represents a methyl group or an ethyl group. In the formula (2), $R^4$ represents a hydrogen atom or a methyl group. X is a group which represents a divalent bridged alicyclic hydrocarbon group having no less than 10 carbon atoms taken together with $R^5$. $R^5$ represents a carbon atom. $R^6$ represents a branched alkyl group having 3 or 4 carbon atoms.

According to further aspect of the present invention, a resist pattern-forming method includes coating the radiation-sensitive resin composition on a substrate to provide a resist coating film. The resist coating film is exposed. The exposed resist coating film is heated. The heated resist coating film is developed.

DESCRIPTION OF THE EMBODIMENTS

According to one aspect of the embodiments of the present invention which has been made for solving the foregoing problem, a radiation-sensitive resin composition includes:

(A) a polymer component having, in an identical polymer or different polymers, a structural unit (I) represented a formula (1) and a structural unit (II) represented a formula (2) (hereinafter, may be also referred to as "polymer component (A)");

(B) a radiation-sensitive acid generating agent (hereinafter, may be also referred to as "acid generating agent (B)"); and (C) a nitrogen-containing compound having a ring structure (hereinafter, may be also referred to as "compound (C)"),

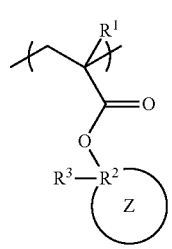

(1)

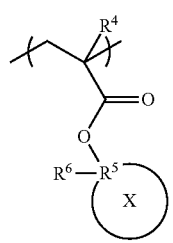

(2)

wherein, in the formula (1), $R^1$ represents a hydrogen atom or a methyl group; Z is a group which represents a divalent monocyclic alicyclic hydrocarbon group taken together with $R^2$; $R^2$ represents a carbon atom; and $R^3$ represents a methyl group or an ethyl group, and in the formula (2), $R^4$ represents a hydrogen atom or a methyl group; X is a group which represents a divalent bridged alicyclic hydrocarbon group having no less than 10 carbon atoms taken together with $R^5$; $R^5$ represents a carbon atom; and $R^6$ represents a branched alkyl group having 3 or 4 carbon atoms.

Since the radiation-sensitive resin composition according to an aspect of the embodiments of the present invention contains the polymer component (A), the acid generating agent (B) and the compound (C), excellent LWR feature, as well as a low limit dimension for pattern collapse and a large amount of residual resist film can be achieved. Without wishing to be bound to particular reasons for the effect to be exerted, the following is assumed, for example: when the radiation-sensitive resin composition according to the embodiment of the present invention has the constitution as described above, the temperature of PEB (post exposure baking) can be lowered to, for example, less than 100° C. due to high dissociability of the acid-dissociable group carried by the structural unit (I) and structural unit (II) of the polymer component (A), and diffusion of the acid generated from the acid generating agent (B) and the like is appropriately controlled through a synergic effect of the lowered temperature of the PEB and moderate basicity of the compound (C).

The polymer component (A) preferably includes a polymer having the structural unit (I) and the structural unit (II). It is also preferred that the polymer component (A) is a mixture containing a polymer having the structural unit (I) and a polymer having the structural unit (II). The radiation-sensitive resin composition can exhibit the effect either when the polymer component (A) contains a copolymer having the structural unit (I) and structural unit (II), or when the polymer component (A) is a mixture containing polymers each having the respective structural units.

The structural unit (I) is preferably a structural unit (I-1) represented a formula (1-1):

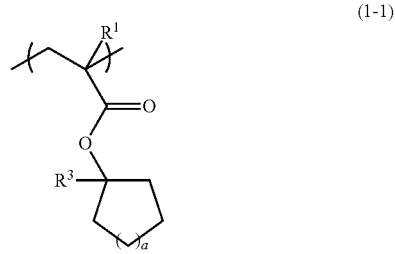

(1-1)

wherein, in the formula (1-1), $R^1$ and $R^3$ are as defined in the above formula (1); and a is 1 or 2.

When the structural unit (I) has the structure specified above, the dissociability of the acid-dissociable group in the case of employing lowered PEB temperatures is expected to be more enhanced, and as a result, properties such as LWR feature, a limit dimension for pattern collapse and a amount of residual resist film will be improved.

The structural unit (II) is preferably a structural unit (II-1) represented a formula (2-1):

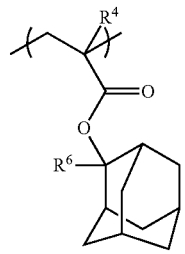

(2-1)

wherein, in the formula (2-1), $R^4$ and $R^6$ are as defined in the above formula (2).

When the structural unit (II) has the structure specified above, the dissociability of the acid-dissociable group in the case of employing lowered PEB temperatures is expected to be further enhanced, and as a result, properties such as the LWR feature, the limit dimension for pattern collapse and the amount of residual resist film will be further improved.

Preferably, the polymer component (A) further has, in an identical polymer or different polymers, a structural unit (III) having a lactone skeleton, a structural unit (IV) having a cyclic carbonate structure or both of the structural unit (III) and the structural unit (IV). When the polymer component (A) further has the structural unit specified above, adhesiveness of the resist pattern formed from the radiation-sensitive resin composition to a substrate can be improved, and as a result, properties such as the LWR feature, the limit dimension for pattern collapse and the amount of residual resist film will be more improved.

The nitrogen-containing compound (C) preferably has an aromatic ring structure, a nitrogen atom-containing heterocyclic structure or both of the same. When the nitrogen-containing compound (C) has the structure specified above, the nitrogen-containing compound (C) is expected to be able to provide suitable basicity, and diffusion of the acid generated from the acid generating agent (B) and the like is appropriately controlled. As a result, properties such as the LWR feature, the limit dimension for pattern collapse and the amount of residual resist film of the radiation-sensitive resin composition will be further improved.

According to another aspect of the embodiments of the present invention, a polymer has a structural unit (I) represented a formula (1), a structural unit (II) represented a formula (2) and a structural unit having a cyclic carbonate structure (IV).

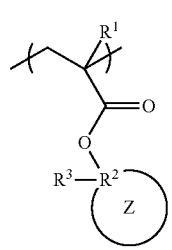

(1)

-continued

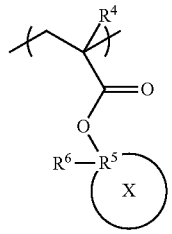

(2)

wherein, in the formula (1), $R^1$ represents a hydrogen atom or a methyl group; Z is a group which represents a divalent monocyclic alicyclic hydrocarbon group taken together with $R^2$; $R^2$ represents a carbon atom; and $R^3$ represents a methyl group or an ethyl group, and in the formula (2), $R^4$ represents a hydrogen atom or a methyl group; X is a group which represents a divalent bridged alicyclic hydrocarbon group having no less than 10 carbon atoms taken together with $R^5$; $R^5$ represents a carbon atom; and $R^6$ represents a branched alkyl group having 3 or 4 carbon atoms.

The polymer has the properties mentioned above, and thus may be suitably used as a component of the radiation-sensitive resin composition.

According to yet other aspect of the embodiments of the present invention, a resist pattern-forming method includes the steps of:

(1) coating the radiation-sensitive resin composition according to an aspect of the embodiments of the present invention on a substrate to provide a resist coating film, (2) exposing the resist coating film, (3) heating the exposed resist coating film, and (4) developing the heated resist coating film.

According to the present resist pattern-forming method, a resist pattern exhibiting low LWR at the PEB temperatures and low limit dimension for pattern collapse, while increasing the amount of residual resist film can be formed, since the radiation-sensitive resin composition as described above is used.

According to the embodiments of the present invention, a radiation-sensitive resin composition and a resist pattern-forming method can be provided in which the excellent LWR feature, as well as the low limit dimension for pattern collapse and the large amount of residual resist film are achieved.

Hereinafter, a preferred mode for carrying out the invention will be explained in detail.

Radiation-Sensitive Resin Composition

The radiation-sensitive resin composition contains (A) a polymer component, (B) an acid generating agent and (C) a compound. In addition, the radiation-sensitive resin composition may contain (D) a solvent as a favorable component, and further may contain other optional components as long as the effects of the invention is not impaired. Hereinafter, the respective components will be explained.

Polymer Component (A)

The polymer component (A) is a polymer component having, in an identical polymer or different polymers, a structural unit (I) and a structural unit (II). The polymer component (A) may contain, for example, a polymer having the structural unit (I) and structural unit (II), or a mixture containing a polymer having the structural unit (I) and a polymer having the structural unit (II). Irrespective of how both structural units are incorporated into the polymer component (A), the radiation-sensitive resin composition allows the excellent LWR feature, as well as the low limit dimension for pattern collapse and the large amount of residual resist film to be achieved.

The polymer component (A) is characterized in that it is initially poorly soluble or insoluble in alkalis, but is converted, by way of the exposure, into an alkali-soluble form since both of the structural units (I) and (II) have a group capable of dissociating by the action of an acid generated upon the exposure and converting into an alkali-soluble form. It is expected that a combination of the structural unit (I) and the structural unit (II) leads to improvement of the dissociability of the acid-dissociable group, allows the PEB temperature to be lowered to, for example, as low as below 100° C., and the diffusion of the acid generated from the acid generating agent (B) and the like into light-unexposed sites to be suppressed, and results in improvement of the amount of residual resist film. In addition, it is contemplated that due to enhanced dissociability of the acid-dissociable group as mentioned above, solubility of light-exposed sites becomes sufficiently high, and hence limit dimension for pattern collapse can be lowered. More specifically, it is expected that in the polymer component (A), the combination of the structural unit (I) and the structural unit (II) enables the solubility in a developer solution and the rigidity of light-exposed site areas and light-unexposed site areas after the PEB to be appropriately controlled, and as a result, the performance of the limit dimension for pattern collapse and the amount of residual resist film can be improved.

The polymer component (A) may have, in addition to the structural unit (I) and structural unit (II), a structural unit (III) having a lactone structure, a structural unit (IV) having a cyclic carbonate structure and other structural units. The respective structural units may include a single structural unit, or a combination of two or more structural units. Hereinafter, each structural unit will be explained.

Structural Unit (I)

The structural unit (I) is represented by the above formula (1). The structural unit (I) is characterized in that it has a specific 1-methyl-substituted monocyclic alicyclic hydrocarbon group or a specific 1-ethyl-substituted monocyclic alicyclic hydrocarbon group.

In the above formula (1), $R^1$ represents a hydrogen atom or a methyl group.

In the formula (1), Z is a group which represents a divalent monocyclic alicyclic hydrocarbon group taken together with $R^2$; $R^2$ represents a carbon atom; and $R^3$ represents a methyl group or an ethyl group.

The $R^1$ is preferably a methyl group in view of polymerizability of monomers that provide the structural unit (I).

Examples of the divalent monocyclic alicyclic hydrocarbon group represented by the above Z taken together with $R^2$ include a cyclopentanediyl group, a cyclohexanediyl group, a cycloheptanediyl group, a cyclooctanediyl group, a cyclononanediyl group, a cyclodecanediyl group, and the like. Among these, the cyclopentanediyl group, the cyclohexanediyl group, and the cyclooctanediyl group is preferred.

The structural unit (I) is preferably a structural unit (I-1) represented by the above formula (1-1).

In the above formula (1-1), $R^1$ and $R^3$ are as defined in the above formula (1); and a is 1 or 2.

"a" is preferably 1.

The proportion of the structural unit (I) is preferably 10 mol % to 60 mol %, more preferably 20 mol % to 60 mol %, still more preferably 30 mol % to 55 mol %, and particularly preferably 40 mol % to 55 mol % with respect to the total structural units in the polymer component (A). When the proportion of the structural unit (I) is in the foregoing range, properties such as the LWR feature, the limit dimension for pattern collapse and the amount of residual resist film of the radiation-sensitive resin composition are improved.

Structural Unit (II)

The structural unit (II) is represented by the above formula (2). The structural unit (II) is characterized in that it has a bridged alicyclic hydrocarbon group substituted by a specific branched alkyl group.

In the above formula (2), $R^4$ represents a hydrogen atom or a methyl group; X is a group which represents a divalent bridged alicyclic hydrocarbon group having no less than 10 carbon atoms taken together with $R^5$; $R^5$ represents a carbon atom; and $R^4$ represents a branched alkyl group having 3 or 4 carbon atoms.

The $R^4$ is preferably a methyl group in view of polymerizability of monomers that provide the structural unit (II).

Examples of the divalent bridged alicyclic hydrocarbon group having no less than 10 carbon atoms represented by the X taken together with $R^5$ include an adamantanediyl group, a bicyclo[2.2.1]heptanediyl group, a tricyclo[4.3.0.1$^{2,5}$]decanediyl group, a tetracyclo[4.4.0.1$^{2,5}$.1$^{7,10}$]dodecanediyl group, and the like. Among these, the adamantanediyl group is preferred.

Examples of the branched alkyl group having 3 or 4 carbon atoms represented by the $R^6$ include an i-propyl group, an i-butyl group, a sec-butyl group, and the like. Among these, the i-propyl group and the i-butyl group are preferred.

The structural unit (II) include a structural unit (II-1) represented by the above formula (2-1), and the like.

In the above formula (2-1), $R^4$ and $R^6$ are as defined in the above formula (2).

The proportion of the structural unit (II) is preferably 5 mol % to 55 mol %, more preferably 5 mol % to 35 mol %, and still more preferably 5 mol % to 20 mol % with respect to the total structural units in the polymer component (A). When the proportion of the structural unit (II) is in the foregoing range, the limit dimension for pattern collapse, amount of residual resist film and LWR can be improved.

Structural Unit (III) and Structural Unit (IV)

The polymer component (A) may suitably have a structural unit (III) having a lactone structure and/or a structural unit (IV) having a cyclic carbonate structure. When the polymer component (A) has these structural units, the radiation-sensitive resin composition exhibits improved LWR feature and MEEF performance, and concurrently the adhesiveness between the provided resist coating film and a substrate is improved; as a result, properties such as the limit dimension for pattern collapse and the amount of residual resist film are also improved.

Examples of the structural unit (III) having a lactone structure include a structural unit represented a formula (3) (hereinafter, may be also referred to as "structural unit (III-1)"), and the like.

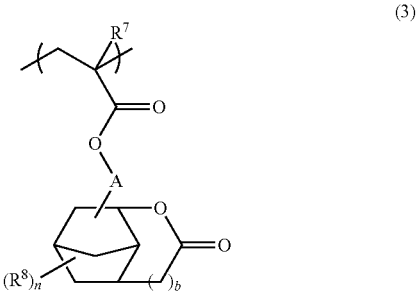

(3)

In the above formula (3), $R^7$ represents a hydrogen atom or a methyl group; $R^8$ represents a linear or branched alkyl group having 1 to 4 carbon atoms, a linear or branched fluorinated alkyl group having 1 to 4 carbon atoms, a linear or branched alkoxy group having 1 to 4 carbon atoms or cyano group; A represents a single bond, a divalent hydrocarbon group having 1 to 4 carbon atoms, *-A'-O—, *-A'-COO— or *-A'-OCO—, wherein A' represents a divalent hydrocarbon group having 1 to 4 carbon atoms; * indicates a bonding site to the oxygen atom; n is an integer of 0 to 3; in a case in which $R^8$ is present in a plurality of number, the plurality of $R^8$s may be the same or different; and b is 0 or 1.

The $R^7$ is preferably a methyl group in view of polymerizability of monomers that provide the structural unit (III-1).

Examples of the linear or branched alkyl group having 1 to 4 carbon atoms represented by the $R^8$ include a methyl group, an ethyl group, a propyl group, a butyl group, and the like. Among these, the methyl group and the ethyl group are preferred.

Examples of the linear or branched fluorinated alkyl group having 1 to 4 carbon atoms represented by the $R^8$ include a trifluoromethyl group, a trifluoroethyl group, a pentafluoroethyl group, and the like. Among these, the trifluoromethyl group is preferred.

Examples of the linear or branched alkoxy group having 1 to 4 carbon atoms represented by the $R^8$ include a methoxy group, an ethoxy group, a propoxy group, a butoxy group, and the like. Among these, the methoxy group is preferred.

Examples of the divalent hydrocarbon group having 1 to 4 carbon atoms represented by the A and A' include linear hydrocarbon groups such as a methylene group, an ethylene group, a 1,3-propylene group, a 1,4-n-butylene group; branched hydrocarbon groups such as a 1,2-propylene group, a 1,2-n-butylene group, a 1,3-n-butylene group, a 1,3-i-butylene group; and the like. Among these, the linear hydrocarbon groups are preferred, and the methylene group and the ethylene group are more preferred.

"b" is preferably 0; and "n" is preferably 0 or 1.

Examples of the structural unit (III-1) include structural units represented a formulae (3-1) to (3-8), and the like:

(3-1)

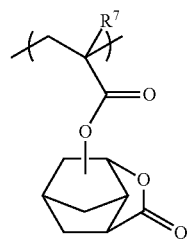

(3-2)

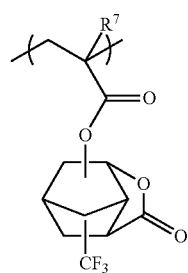

(3-3)

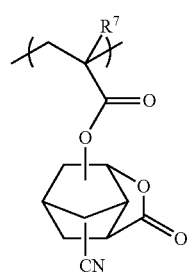

(3-4)

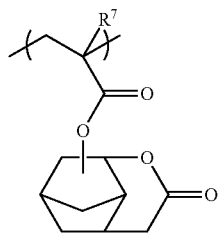

(3-5)

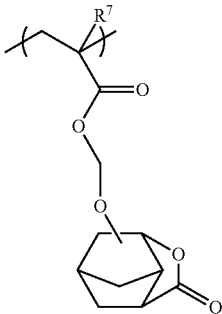

(3-6)

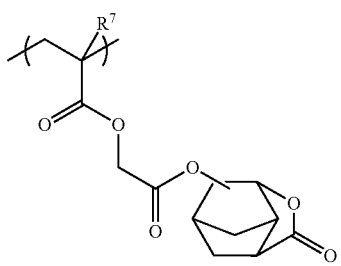

(3-7)

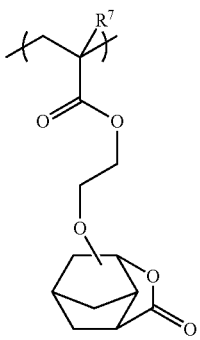

(3-8)

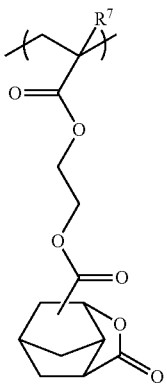

wherein, in the above formulae (3-1) to (3-8), $R^7$ is as defined in the above formula (3).

Among these, the structural unit represented by the formula (3-1) is preferred.

Examples of the structural unit (III) having a lactone structure include, in addition to the structural unit (III-1), structural units represented a formulae (4-1) to (4-9), and the like.

(4-1)
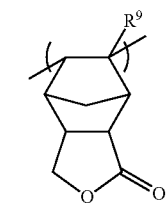

(4-2)
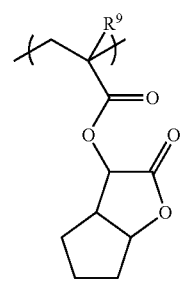

(4-3)
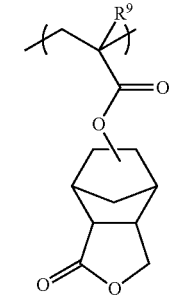

(4-4)
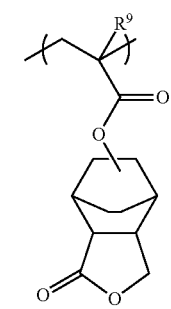

(4-5)
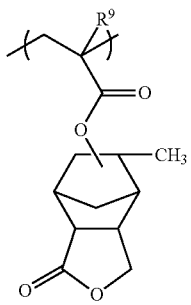

(4-6)
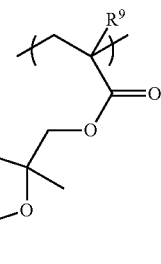

(4-7)
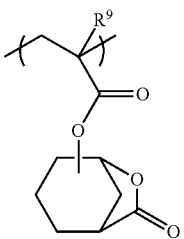

(4-8)
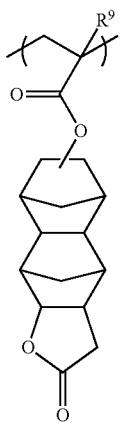

(4-9)
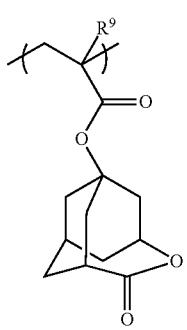

In the above formulae (4-1) to (4-9), $R^9$ represents a hydrogen atom or a methyl group.

Examples of the structural unit (IV) having a cyclic carbonate structure include structural units represented a formulae (5-1) to (5-21), and the like.

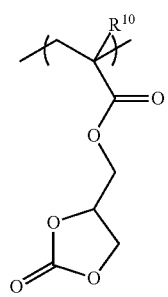
(5-1)
(5-2)
(5-3)
(5-4)
-continued
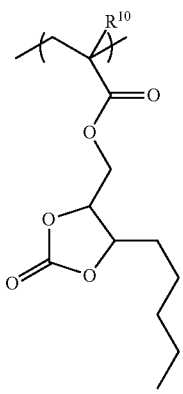
(5-5)
(5-6)
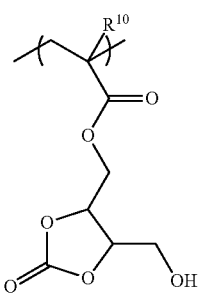
(5-7)
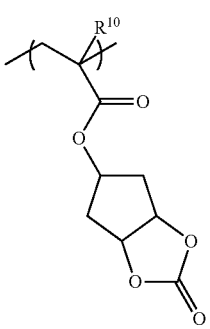
(5-8)
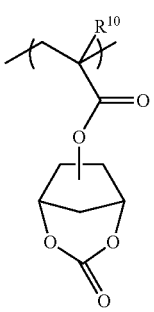

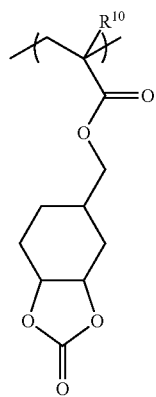 (5-9)
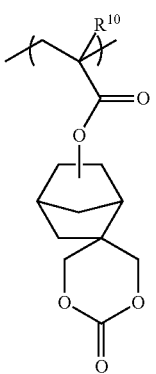 (5-10)
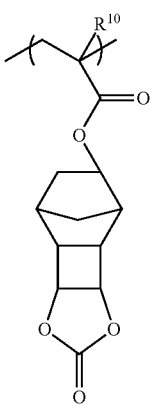 (5-11)
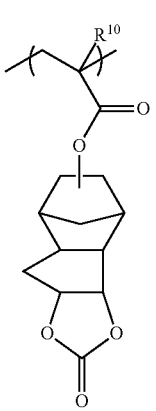 (5-12)
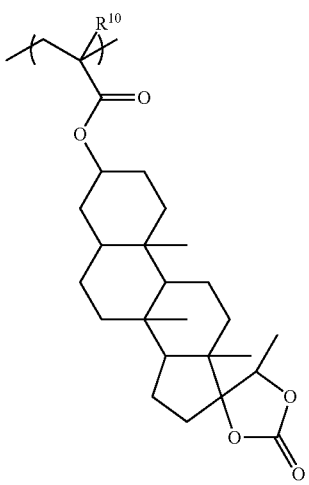 (5-13)
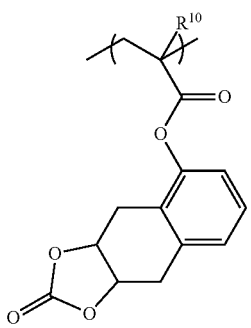 (5-14)
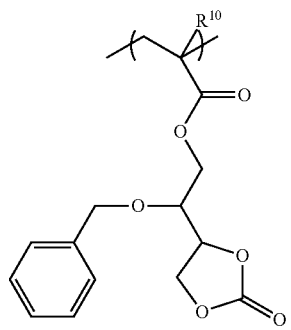 (5-15)
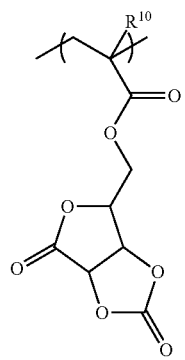 (5-16)

(5-17)
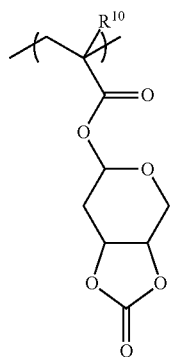

(5-18)
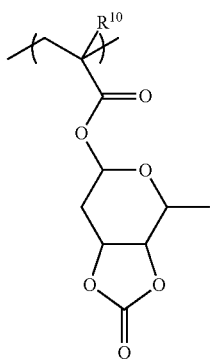

(5-19)
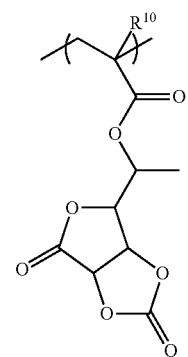

(5-20)
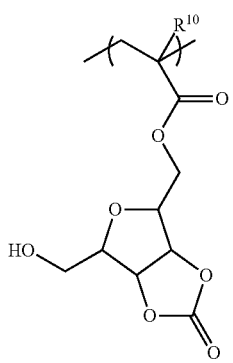

(5-21)
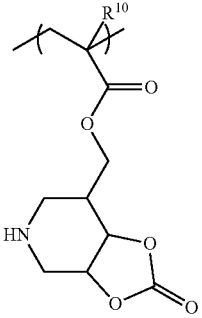

In the above formulae (5-1) to (5-21), $R^{10}$ represents a hydrogen atom or a methyl group.

Among these, the structural unit represented by the formula (5-1) is preferred.

The proportion of the structural unit (III) and the structural unit (IV) is typically no greater than 70 mol %, preferably 20 mol % to 65 mol %, and more preferably 30 mol % to 60 mol % with respect to the total structural units in the polymer component (A). When the proportion of the structural unit (III) and the structural unit (IV) is in the foregoing range, the radiation-sensitive resin composition exhibits improved LWR feature and adhesiveness between the provided resist coating film and a substrate; as a result, properties such as the limit dimension for pattern collapse and the amount of residual resist film are also improved.

Other Structural Unit

Examples of other structural units include structural units derived from monomers such as adamantan-1-yl(meth)acrylate, 3-methyladamantan-1-yl(meth)acrylate, 3-ethyladamantan-1-yl(meth)acrylate, 3-hydroxyadamantan-1-yl (meth)acrylate, 3,5-dihydroxyadamantan-1-yl(meth) acrylate, 3-cyanoadamantan-1-yl(meth)acrylate, 3-carboxyadamantan-1-yl(meth)acrylate, 3,5-dicarboxyadamantan-1-yl(meth)acrylate, 3-carboxy-5-hydroxyadamantan-1-yl(meth)acrylate, 3-methoxycarbonyl-5-hydroxyadamantan-1-yl(meth)acrylate; and the like.

The proportion of the other structural units is preferably 0 to 20 mol % with respect to the total structural units in the polymer component (A).

The content of the polymer component (A) is preferably no less than 70% by mass, and more preferably no less than 80% by mass with respect to the total solid content of the radiation-sensitive resin composition.

Synthesis of Polymer(s) Constituting Polymer Component (A)

The polymer(s) constituting the polymer component (A) can be synthesized according to conventionally well-known methods such as radical polymerization; examples of the synthetic method include a method in which a reaction solution containing each monomer and a radical initiator is added dropwise to another reaction solution containing a reaction solvent or the monomer, and the mixture is polymerized; a method in which a reaction solution containing each monomer and a reaction solution containing a radical initiator are each separately added dropwise to another reaction solution containing a reaction solvent or the monomer, and the mixture is polymerized; and a method in which one or more reaction solutions each prepared so as to contain a single monomer and a reaction solution containing a radical initiator are each separately added dropwise to another reaction solution containing a reaction solvent or the monomer, and the mixture is polymerized; and the like.

The reaction temperature in the polymerization reaction may be appropriately set depending on the type of the initiator, but is preferably 30 to 180° C., more preferably 40 to 160° C., and still more preferably 50 to 140° C. The time required for the dropwise addition may be appropriately determined depending on the reaction temperature, the type of the initiator, and the monomers to be reacted, but is preferably 30 min to 8 hrs, more preferably 45 min to 6 hrs, and still more preferably 1 hr to 5 hrs. In addition, the total reaction time including the time for the dropwise addition may be appropriately determined, but is preferably 30 min to 8 hrs, more preferably 45 min to 7 hrs, and still more preferably 1 hr to 6 hrs. When the dropwise addition to a solution containing a monomer is conducted, the ratio of the monomer in the added solution is preferably no less than 30 mol %, more preferably no less than 50 mol %, and still more preferably 70 mol % with respect to the total amount of the monomer used in the polymerization.

Examples of the radical initiator for use in the polymerization include 2,2'-azobis(4-methoxy-2,4-dimethyl valeronitrile), 2,2'-azobis(2-cyclopropylpropionitrile), 2,2'-azobis(2,4-dimethylvaleronitrile), 2,2'-azobisisobutyronitrile (AIBN), 2,2'-azobis(2-methylbutyronitrile), 1,1'-azobis(cyclohexane-1-carbonitrile), 2,2'-azobis(2-methyl-N-phenylpropionamidine)dihydrochloride, 2,2'-azobis(2-methyl-N-2-propenyl-propionamidine)dihydrochloride, 2,2'-azobis[2-(5-methyl-2-imidazolin-2-yl)propane]dihydrochloride, 2,2'-azobis[2-methyl-N-[1,1-bis(hydroxymethyl)-2-hydroxyethyl]propionamide], dimethyl-2,2'-azobis(2-methylpropionate), 4,4'-azobis(4-cyanovaleric acid), 2,2'-azobis(2-(hydroxymethyl)propionitrile), and the like. These initiators may be used alone, or in combination of two or more thereof.

The solvent used in the polymerization reaction may be any reaction solvent as long as the solvent dissolves the monomers employed and is not any solvent which inhibits the polymerization (for example, nitrobenzenes, and mercapto compounds). Examples of suitable solvent include alcohols, ethers, ketones, amides, esters, lactones, nitriles, a mixed solvent thereof, and the like.

Examples of the alcohols include methanol, ethanol, propanol, isopropanol, butanol, ethylene glycol, propylene glycol, ethylene glycol monomethyl ether, ethylene glycol monoethyl ether, 1-methoxy-2-propanol, and the like.

Examples of the ethers include propyl ether, isopropyl ether, butyl methyl ether, tetrahydrofuran, 1,4-dioxane, 1,3-dioxolane, 1,3-dioxane, and the like.

Examples of the ketones include acetone, methyl ethyl ketone, diethyl ketone, methyl isopropyl ketone, methyl isobutyl ketone, and the like.

Examples of the amides include N,N-dimethylformamide, N,N-dimethylacetamide, and the like.

Examples of the esters include ethyl acetate, methyl acetate, isobutyl acetate, and the like.

Examples of the lactones include γ-butyrolactone, and the like.

Examples of the nitriles include acetonitrile, propionitrile, butyronitrile, and the like.

These solvents may be used alone, or in combination of two or more thereof.

After completion of the polymerization reaction, the polymerization solution is preferably charged into a reprecipitation solvent, to recover the targeted polymer in a powder form. As the reprecipitation solvent, for example, water, and solvents exemplified as the solvent used in the polymerization reaction and the like may be employed.

The weight average molecular weight (Mw) of the polymer component (A) as determined by gel permeation chromatography (GPC) is preferably 1,000 to 100,000, more preferably 1,500 to 80,000, and still more preferably 2,000 to 50,000. The Mw of the polymer component (A) of less than 1,000 tends to result in deteriorated heat resistance of the resist coating film. On the other hand, the Mw exceeding 100,000 is likely to result in deteriorated developability of the resist coating film. In addition, the ratio (Mw/Mn) of the Mw to the number average molecular weight (Mn) of the polymer component (A) is preferably 1 to 5, and more preferably 1 to 3.

The content of impurities such as halogens and metals in the polymer component (A) used in the radiation-sensitive resin composition is more favorably as low as possible. When the content of the impurities in the polymer component (A), and in the radiation-sensitive resin composition in turn, is lower, sensitivity, resolution, process stability, pattern configuration and the like can be further enhanced when the resist coating film is provided. Examples of the purification method of the polymerization solutions in the production of the polymer component (A) include chemical purification methods such as washing with water, liquid-liquid extraction, combined methods of the chemical purification methods with physical purification methods such as ultrafiltration, centrifugal separation, and the like.

The polymer thus synthesized may be used as the polymer component (A) either alone or as a mixture of two or more thereof.

Acid Generating Agent (B)

The acid generating agent (B) is a compound that generates an acid by irradiation with a radioactive ray. The acid generating agent (B) includes onium salts such as sulfonium salts, iodonium salts; organic halogenated compounds; sulfone compounds such as disulfones, and diazomethanesulfones; and the like.

The acid generating agent (B) is preferably a member of onium salts, more preferably a member of sulfonium salts; still more preferably, the acid generating agent (B) is a member of sulfonium salt compounds represented a formula (6), among others. The radiation-sensitive resin composition is superior in terms of absorption efficiency of radioactive rays due to its containing the acid generating agent.

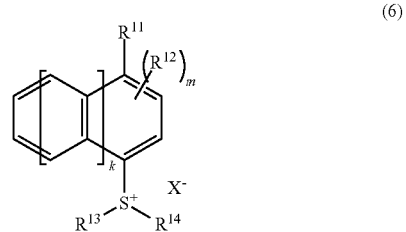

(6)

In the above formula (6), $R^{11}$ represents a hydrogen atom, a hydroxyl group, a linear or branched alkyl group having 1 to 10 carbon atoms, a linear or branched alkoxyl group having 1 to 10 carbon atoms or a linear or branched alkoxycarbonyl group having 2 to 11 carbon atoms. $R^{12}$ represents a linear or branched alkyl group having 1 to 10 carbon atoms. m is an integer of 0 to 10. Provided that $R^{12}$ is present in a plurality of number, the plurality of $R^{12}$s may be the same or different. $R^{13}$ and $R^{14}$ each independently represent a linear or branched alkyl group having 1 to 10 carbon atoms, a phenyl group or a naphthyl group. A part or all of hydrogen atoms included in the alkyl group, phenyl group and naphthyl group may be substituted. Alternatively, $R^{13}$ and $R^{14}$ may each bind to form, together with the sulfur atom to which they bind, a ring structure having 2 to 10 carbon atoms. "k" is an integer of 0 to 2. $X^-$ represents $R^aC_xF_{2x}SO_3^-$, wherein $R^a$ represents a fluorine atom or an optionally substituted hydrocarbon group having 1 to 12 carbon atoms; x is an integer of 1 to 10.

Examples of the linear or branched alkyl group having 1 to 10 carbon atoms represented by the $R^{11}$, $R^{12}$, $R^{13}$ and $R^{14}$ include a methyl group, an ethyl group, a n-propyl group, an i-propyl group, a n-butyl group, an i-butyl group, a n-pentyl group, a n-hexyl group, a n-heptyl group, a n-octyl group, a n-nonyl group, a n-decyl group, and the like.

Examples of the linear or branched alkoxyl group having 1 to 10 carbon atoms represented by $R^{11}$ include a methoxy group, an ethoxy group, a n-propoxy group, an i-propoxy group, a n-butoxy group, an i-butoxy group, a n-pentyloxy group, a n-hexyloxy group, and the like.

Examples of the linear or branched alkoxycarbonyl group having 2 to 11 carbon atoms represented by $R^{11}$ include a methoxycarbonyl group, an ethoxycarbonyl group, a n-propoxy carbonyl group, an i-propoxycarbonyl group, a n-butoxycarbonyl group, an i-butoxycarbonyl group, a n-pentyloxycarbonyl group, a n-hexyloxycarbonyl group, and the like.

"k" is preferably 0 or 1.

Examples of the optionally substituted hydrocarbon group having 1 to 12 carbon atoms represented by the $R^a$ include linear or branched alkyl groups such as a methyl group, and an ethyl group; alicyclic hydrocarbon groups such as a cyclopentyl group, a cyclohexyl group, a norbornyl group and an adamantyl group, and the like.

"x" is preferably 1 to 4.

The sulfonium cation represented by the above formula (6) is preferably a cation represented a formula (6-1) and a cation represented by formula (6-2) in view of improving the absorption efficiency of radioactive rays.

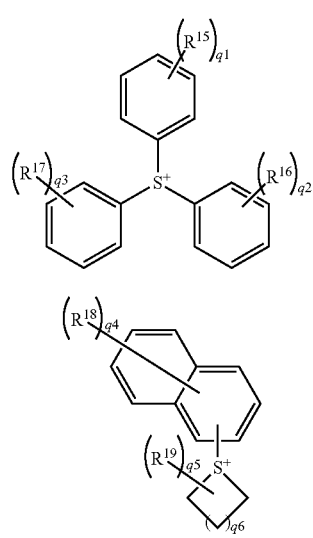

In the above formula (6-1), $R^{15}$, $R^{16}$ and $R^{17}$ each independently represent a hydroxyl group, an optionally substituted linear or branched alkyl group having 1 to 12 carbon atoms or an optionally substituted aryl group having 6 to 12 carbon atoms. q1, q2 and q3 are each independently an integer of 0 to 5. Provided that $R^{15}$, $R^{16}$ and $R^{17}$ are each present in a plurality of number, the plurality of $R^{15}$s, $R^{16}$s and $R^{17}$s are each optionally the same or different.

In the above formula (6-2), $R^{18}$ represents a hydroxyl group, a linear or branched alkyl group having 1 to 8 carbon atoms or an aryl group having 6 to 8 carbon atoms. A part or all of hydrogen atoms included in the alkyl group and aryl group may be substituted. $R^{19}$ represents a hydrogen atom, a linear or branched alkyl group having 1 to 7 carbon atoms or an aryl group having 6 to 7 carbon atoms. A part or all of hydrogen atoms included in the alkyl group and aryl group may be substituted. q4 is an integer of 0 to 7. q5 is an integer of 0 to 6. Provided that $R^{18}$ and $R^{19}$ are each present in a plurality of number, the plurality of $R^{18}$s and $R^{19}$s are each optionally the same or different. In addition, two $R^{19}$s may each bind to form a ring structure. q6 is an integer of 0 to 3.

Examples of the sulfonium cation represented by the above formula (6) include the cations represented a formulae (i-1) to (i-63), and the like.

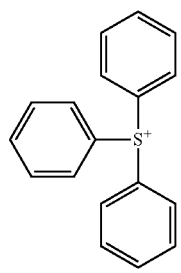

(i-1)

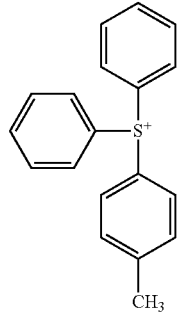

(i-2)

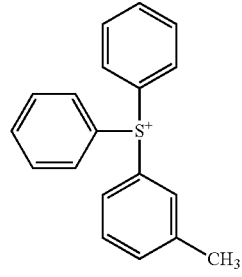

(i-3)

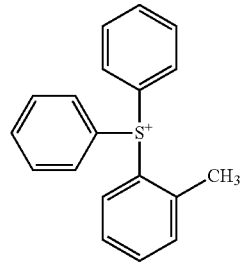

(i-4)

(i-5)
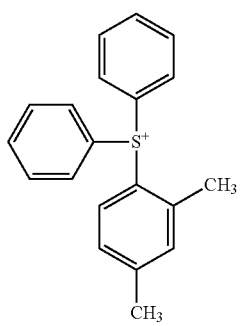
(i-6)
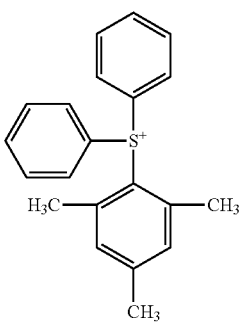
(i-7)
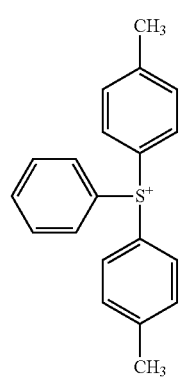
(i-8)
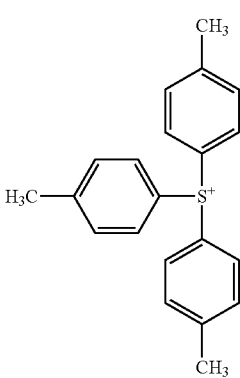
(i-9)
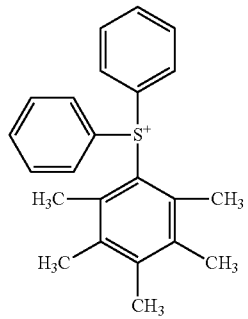
(i-10)
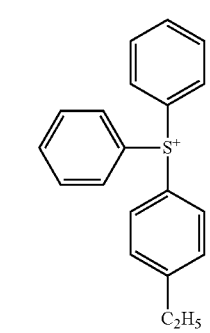
(i-11)
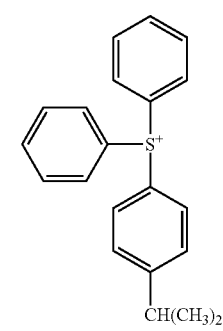
(i-12)
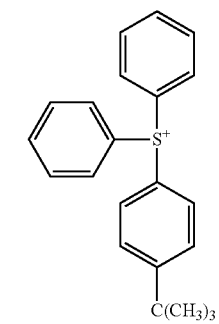

(i-13)
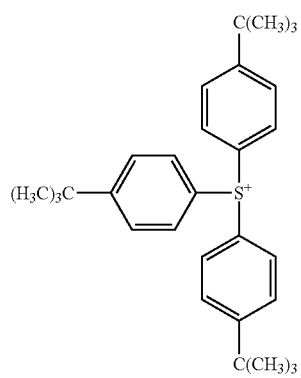
(i-14)
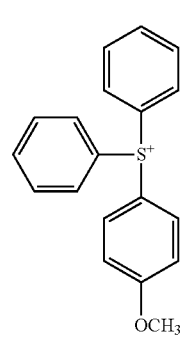
(i-15)
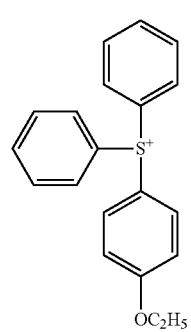
(i-16)
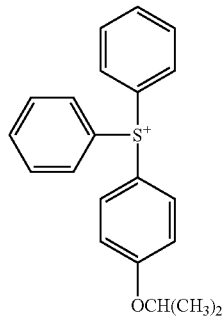
(i-17)
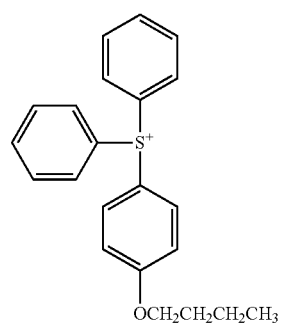
(i-18)
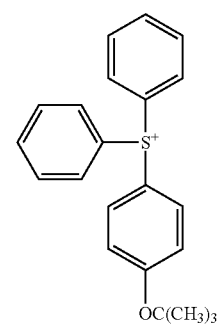
(i-19)
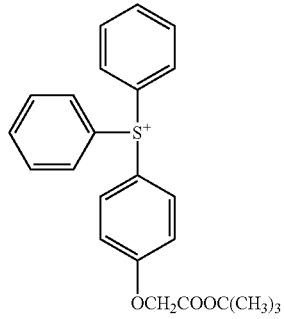
(i-20)
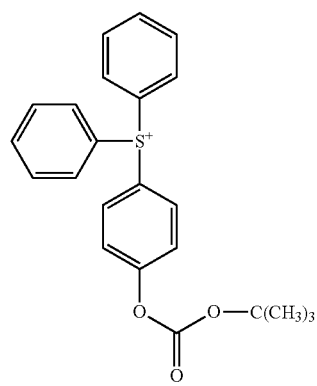

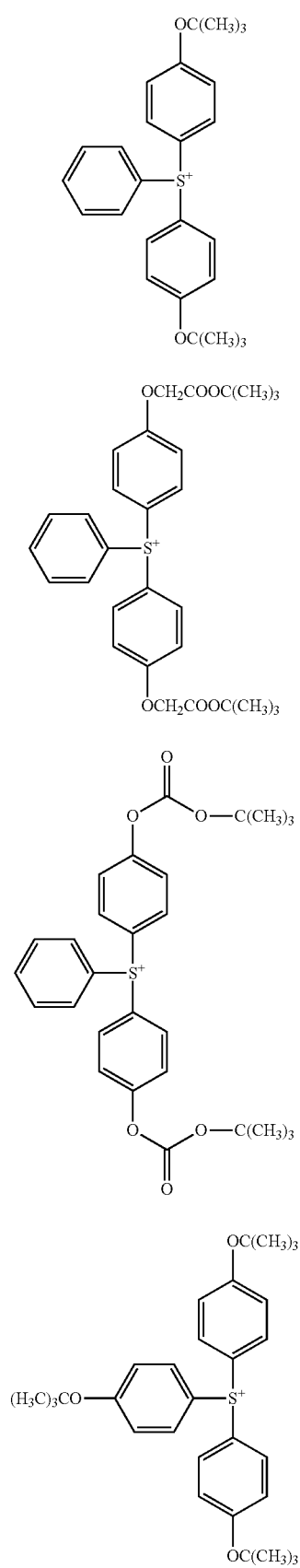
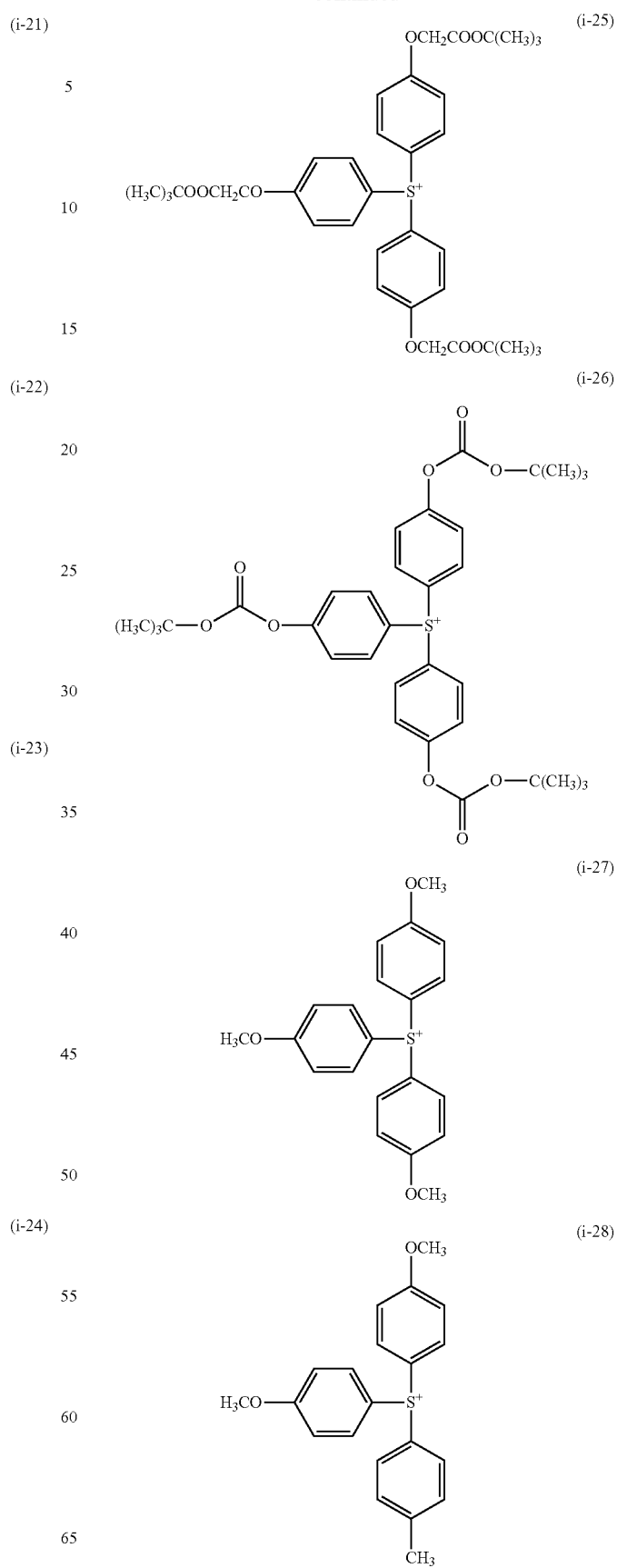

(i-29) 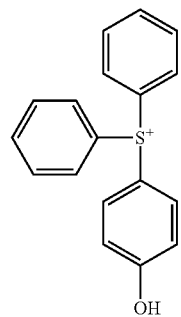
(i-30) 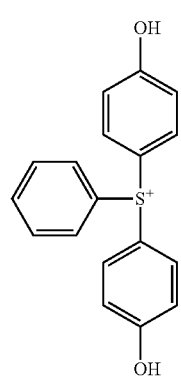
(i-31) 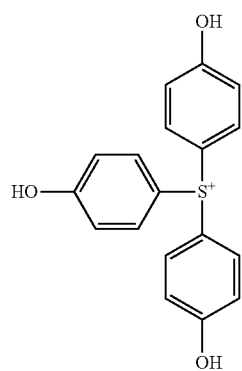
(i-32) 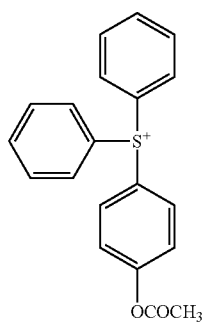
(i-33) 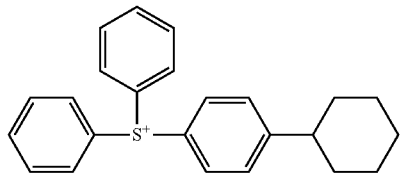
(i-34) 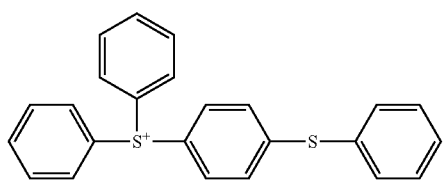
(i-35) 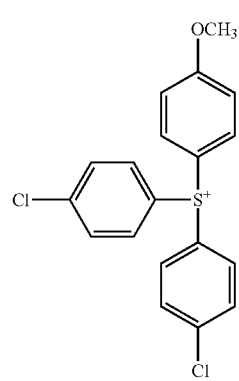
(i-36) 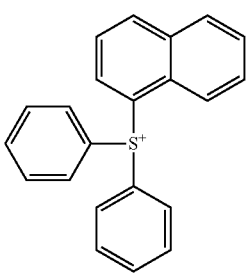
(i-37) 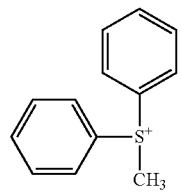
(i-38) 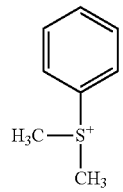
(i-39) 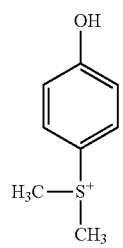
(i-40)

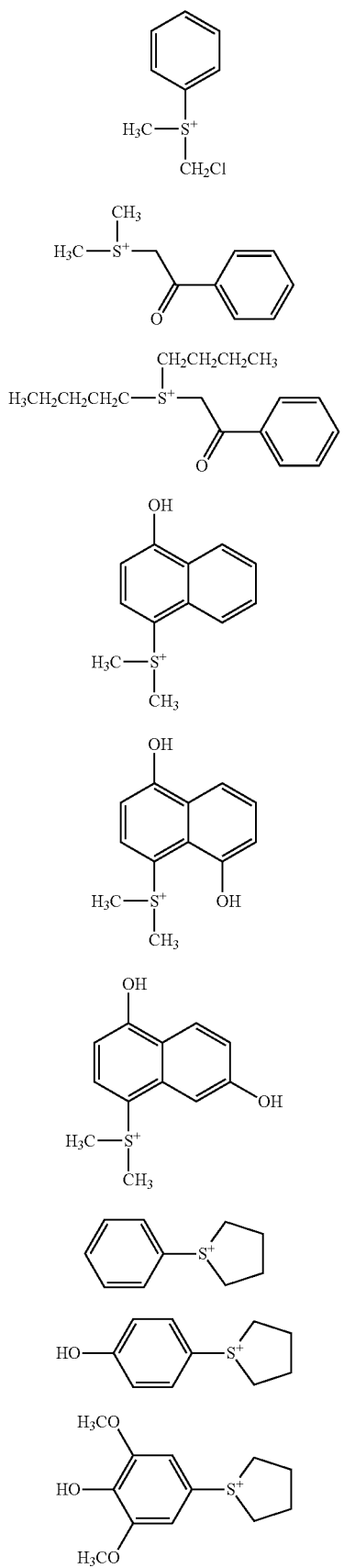
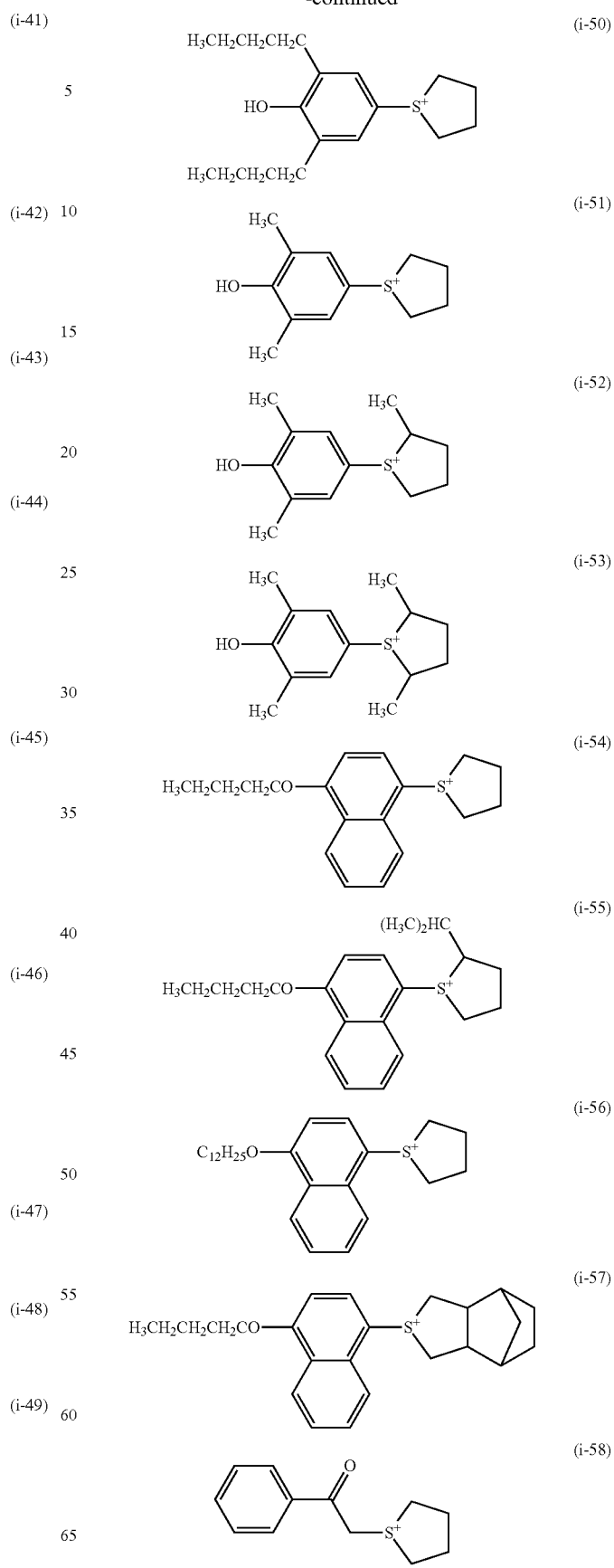

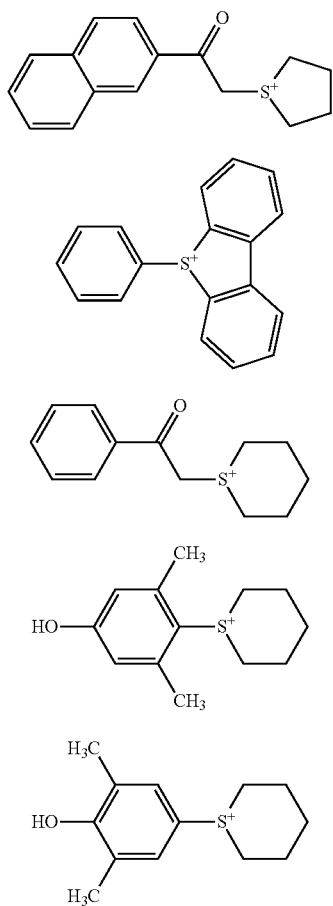

(i-59)
(i-60)
(i-61)
(i-62)
(i-63)

Among these, the sulfonium cations represented by the formula (i-1), the formula (i-2), the formula (i-6), the formula (i-8), the formula (i-13), the formula (i-19), the formula (i-25), the formula (i-27), the formula (i-29), the formula (i-33), the formula (i-51) and the formula (i-54) specified above are preferred; the sulfonium cation represented by the above formula (i-1); and the sulfonium cation represented by the formula (i-33) are more preferred.

The content of the acid generating agent (B) is preferably 1 part by mass to 50 parts by mass, more preferably 2 parts by mass to 30 parts by mass, and still more preferably 5 parts by mass to 20 parts by mass with respect to 100 parts by mass of the polymer component (A). The acid generating agent (B) may be used alone, or in combination of two or more thereof.

Compound (C)

The compound (C) is a nitrogen-containing compound having a ring structure. The compound (C) is expected to have moderate basicity, and to serve as a favorable acid diffusion controller in the radiation-sensitive resin composition. More specifically, the compound (C) is expected to control diffusion phenomenon of the acid generated from the acid generating agent (B) and the like upon the exposure into the resist coating film, and to suppress unfavorable chemical reactions in light-unexposed regions. As a result, as a synergic effect with the lowered PEB temperatures resulting from the improvement of the dissociability of the acid-dissociable group of the polymer component (A), the radiation-sensitive resin composition allows excellent LWR feature, as well as a low limit dimension for pattern collapse and a large amount of residual resist film to be exhibited. In addition, when the compound (C) is contained, storage stability of the radiation-sensitive resin composition and resolution of the resultant resist can be improved, while suppressing variation of line width of the resist pattern caused by variation of post-exposure delay (PED) from the exposure to heat treatment, which enables the radiation-sensitive resin composition with superior process stability to be obtained.

Examples of the ring structure include aromatic ring structures, alicyclic structures, nitrogen atom-containing heterocyclic structures such as an nitrogen atom-containing aliphatic heterocyclic structure, an nitrogen atom-containing aromatic heterocyclic structure, and the like.

It should be noted that the compound (C) favorably includes also a compound that has a structure derived by substituting a hydrogen atom of an amino group of a nitrogen-containing compound having an amino group with an alkoxycarbonyl group such as, e.g., a t-butoxycarbonyl group, and is degradable by the action of an acid to generate the amino group, and the like.

Examples of the compound (C) include:

compounds having an aromatic ring structure, such as, for example;

aniline, N-methylaniline, N,N-dimethylaniline, 2-methylaniline, 3-methylaniline, 4-methylaniline, 4-nitroaniline, 2,6-dimethylaniline, 2,6-diisopropylaniline, N,N-di(hydroxyethyl)aniline, 1,3-bis[1-(4-aminophenyl)-1-methylethyl]benzenetetramethylenediamine, N-t-butoxycarbonyl-4,4'-diaminodiphenylmethane, N,N'-di-t-butoxycarbonyl-4, 4'-diaminodiphenylmethane.

Examples of compounds having an alicyclic structure include:

monocycloalkylamines such as cyclohexyldimethylamine; dicycloalkylamines such as dicyclohexylmethylamine and N-t-butoxycarbonyldicyclohexylamine; tricycloalkylamines such as tricyclohexylamine;

N-t-alkoxycarbonylcycloalkylamines such as N-t-butoxycarbonyl-1-adamantylamine, N-t-butoxycarbonyl-2-norbornylamine, N-t-butoxycarbonyl-2-adamantylamine, N-t-butoxycarbonyl-N-methyl-1-adamantylamine, N-t-butoxycarbonyl-N-ethyl-1-adamantylamine and N,N-di-t-butoxycarbonyl-1-adamantylamine.

Examples of compounds having a nitrogen atom-containing heterocyclic structure include:

compounds having a nitrogen atom-containing aromatic heterocyclic structure, including pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, and nicotinic acid amide; quinolines such as quinoline, 4-hydroxyquinoline, and 8-oxyquinoline; acridine, pyrazine, pyrazole, pyridazine, quinoxaline, and purine; imidazoles such as imidazole, 4-methylimidazole, 1-benzyl-2-methylimidazole, and 4-methyl-2-phenylimidazole; and benzimidazoles such as benzimidazole, 2-phenylbenzimidazole, N-t-butoxycarbonylbenzimidazole, N-t-butoxycarbonyl-2-methylbenzimidazole, and N-t-butoxycarbonyl-2-phenylbenzimidazole;

compounds having a nitrogen atom-containing aliphatic heterocyclic structure, including piperazines such as piperazine, 1,4-dimethylpiperazine, N,N'-di-t-butoxycarbonyl piperazine, and 1-(2-hydroxyethyl)piperazine; pyrrolidines such as pyrrolidine, N-t-butoxycarbonylpyrrolidine, (S)-(−)-1-(t-butoxycarbonyl)-2-pyrrolidinemethanol, and (R)-(+)-1-(t-butoxycarbonyl)-2-pyrrolidinemethanol; piperidines such as piperidine, N-t-butoxycarbonyl-4-hydroxypiperidine, N-t-amyloxy-4-hydroxypiperidine, and 3-piperidino-1,2-propane diol; morpholines such as morpholine, and 4-methylmorpholine; and 1,4-diazabicyclo[2.2.2]octane, and the like.

Among these, the compounds having an aromatic ring structure, and the compounds having a nitrogen atom-containing heterocyclic structure are preferred in view of their having moderate basicity, the compounds having an aromatic ring structure; the compounds having a nitrogen atom-containing aliphatic heterocyclic structure are more preferred; and 2,6-diisopropylaniline, and N-t-amyloxycarbonyl-4-hydroxypiperidine are still more preferred. When the basicity of the compound (C) is too high, patterns tend to be formed into a T-Top shape, and limit dimension for pattern collapse tend to be increased. To the contrary, the basicity of the compound (C) is too low, the diffusion of the acid into light-unexposed sites cannot be sufficiently suppressed due to lack of acid diffusion controllability, and a amount of residual resist film tend to be reduced.

In addition, other nitrogen-containing compounds having no ring structure may be used in conjunction with the compound (C) as long as the effects of the invention is not impaired. Examples of the other nitrogen-containing compounds include tri(cyclo)alkylamines such as triethylamine, tri-n-propylamine, tri-n-butylamine, tri-n-pentylamine, tri-n-hexylamine, tri-n-heptylamine, and tri-n-octylamine; alkanolamines such as triethanolamine; tertiary amine compounds such as N,N,N',N'-tetramethylethylenediamine, N,N,N',N'-tetrakis(2-hydroxypropyl)ethylenediamine, bis(2-dimethylaminoethyl)ether, and bis(2-diethylaminoethyl)ether; quaternary ammonium hydroxide compounds such as tetra-n-propylammonium hydroxide, and tetra-n-butylammonium hydroxide; and the like.

The content of the compound (C) is preferably 0.001 parts by mass to 10 parts by mass, more preferably 0.1 parts by mass to 5 parts by mass, still more preferably 0.2 parts by mass to 3 parts by mass, and particularly preferably 0.5 parts by mass to 2 parts by mass with respect to 100 parts by mass of the polymer component (A). When the content of the compound (C) exceeds 10 parts by mass, the sensitivity of the radiation-sensitive resin composition may be lowered. To the contrary, when the content is less than 0.001 parts by mass, the effect of the improvement of the limit dimension for pattern collapse and the like may not sufficiently achieved.

Solvent (D)

The radiation-sensitive resin composition according to an aspect of the embodiments of the present invention typically contains a solvent (D).

Examples of the solvent (D) include:

ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate;

propylene glycol monoalkyl ethers such as propylene glycol monomethyl ether, propylene glycol monoethyl ether, propylene glycol mono-n-propyl ether, and propylene glycol mono-n-butyl ether;

propylene glycol dialkyl ethers such as propylene glycol dimethyl ether, propylene glycol diethyl ether, propylene glycol di-n-propyl ether, and propylene glycol di-n-butyl ether;

propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate;

lactate esters such as methyl lactate, ethyl lactate, n-propyl lactate, and i-propyl lactate;

formate esters such as n-amyl formate, and i-amyl formate;

acetate esters such as ethyl acetate, n-propyl acetate, i-propyl acetate, n-butyl acetate, i-butyl acetate, n-amyl acetate, i-amyl acetate, 3-methoxybutyl acetate, and 3-methyl-3-methoxybutyl acetate;

propionate esters such as i-propyl propionate, n-butyl propionate, i-butyl propionate, and 3-methyl-3-methoxybutyl propionate;

other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methyl-3-methoxybutyl butyrate, methyl acetoacetate, ethyl acetoacetate, methyl pyruvate, and ethyl pyruvate;

aromatic hydrocarbons such as toluene and xylene;

ketones such as methyl ethyl ketone, 2-pentanone, 2-hexanone, 2-heptanone, 3-heptanone, 4-heptanone, and cyclohexanone;

amides such as N-methylformamide, N,N-dimethyl formamide, N-methylacetamide, N,N-dimethylacetamide, and N-methylpyrrolidone;

lactones such as γ-butyrolactone; and the like.

Of these, propylene glycol monoalkyl ether acetates, ketones, and lactones are preferred, and propylene glycol monomethyl ether acetate, cyclohexanone, and γ-butyrolactone are more preferred. The solvent (D) may be used alone, or in combination of two or more thereof.

Other Optional Components

The radiation-sensitive resin composition according to an aspect of the embodiments of the present invention may further contain other optional components such as polymer additives, alicyclic additives having an acid-dissociable group, surfactants, sensitizers, alkali-soluble resins, low-molecular-weight alkali-solubility controllers having an acid-dissociable protecting group, halation inhibitors, storage stabilizing agents, and defoaming agents. The other optional component may be used alone, or in combination of two or more thereof.

Fluorine Atom-Containing Polymer

The radiation-sensitive resin composition may contain a fluorine atom-containing polymer. When a resist coating film is formed using the radiation-sensitive resin composition containing the polymer component (A) and the fluorine atom-containing polymer, there is observed a tendency that distribution of the fluorine atom-containing polymer on a surface of the resist coating film is promoted due to oil repellency of the fluorine atom-containing polymer. More specifically, the fluorine atom-containing polymer is unevenly distributed in the surface layer of the resist coating film. Therefore, separate formation of an upper layer film aiming at blocking the resist coating film from a liquid immersion medium is not required, and such a radiation-sensitive resin composition can be suitably used in the liquid immersion lithography process.

Examples of the fluorine atom-containing polymer include polymers having a structural unit derived from fluorinated alkyl(meth)acrylates, fluorinated alkyl(meth)acrylates having an alkoxycarbonyl group as a substituent, fluorinated alkyl(meth)acrylates having an alkoxy group as a substituent and the like, and the like.

The content of the fluorine atom-containing polymer is preferably 0.5 parts by mass to 15 parts by weight, and more preferably 1 part by mass to 8 parts by weight with respect to 100 parts by mass of the polymer component (A).

Alicyclic Additives

The alicyclic additives having an acid-dissociable group is a component which has the effect of further improving dry etching resistance, pattern configuration, adhesiveness to a substrate, and the like. Examples of the alicyclic additive include adamantane derivatives such as t-butyl 1-adamantanecarboxylate, t-butoxycarbonylmethyl 1-adamantanecarboxylate, di-t-butyl 1,3-adamantanedicarboxylate, t-butyl 1-adamantaneacetate, t-butoxycarbonylmethyl 1-adamantaneacetate, and di-t-butyl 1,3-adamantanediacetate; deoxycholic acid esters such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and deoxycholic acid mevalonolactone ester; lithocholic acid esters such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and lithocholic acid mevalonolactone ester; and the like.

Surfactant

The surfactant is a component which has the effect of further improving coating property, striation, developability and the like. Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, polyethylene glycol distearate, and the like. Commercially available products of the surfactant include KP341 (manufactured by Shin-Etsu Chemical Co., Ltd.); POLYFLOW No. 75, and No. 95 (manufactured by Kyoeisha Chemical Co., Ltd.), F-top EF301, EF303, and EF352 (manufactured by Tochem Products Co. Ltd.), Megafac F171, F173 (manufactured by Dainippon Ink And Chemicals, Incorporated), Fluorad FC430, and FC431 (manufactured by Sumitomo 3M Ltd.), AsahiGuard AG710, Surflon S-382, SC-101, SC-102, SC-103, SC-104, SC-105, and SC-106 (manufactured by Asahi Glass Co., Ltd.), and the like.

Preparation Method of Radiation-Sensitive Resin Composition

The radiation-sensitive resin composition can be obtained, for example, by dissolving the polymer component (A), the acid generating agent (B), the compound (C), and the optional components, if necessary, in the solvent (D), followed by filtration through a filter having a pore size of about 200 nm. The total solid content of the radiation-sensitive resin composition is typically 1% by mass to 50% by mass, and preferably 2% by mass to 25% by mass.

Resist Pattern-Forming Method

The resist pattern-forming method according to another aspect of the embodiments of the present invention includes the steps of:

(1) coating the radiation-sensitive resin composition according to an aspect of the embodiments of the present invention on a substrate, to provide a resist coating film, (2) exposing the resist coating film, (3) heating the exposed resist coating film, and (4) developing the heated resist coating film.

According to the resist pattern-forming method, the PEB temperature can be lowered, and as a result, a positive type resist pattern exhibiting low LWR and low limit dimension for pattern collapse, while increasing the amount of residual resist film can be formed, since the radiation-sensitive resin composition described above is used. Hereinafter, each step will be explained.

Step (1)

In the step (1), a resist coating film is formed by coating the radiation-sensitive resin composition on a substrate. The resist coating film is formed by coating the radiation-sensitive resin composition on a substrate such as, for example, a silicon wafer and a wafer coated with aluminum by appropriate coating means such as means of spin-coating, cast coating, and roll coating. During the step (1), it is preferred to carry out prebaking (PB), to evaporate any solvent present in the resist coating film, if necessary.

In addition, in order to maximally utilize the potential of the radiation-sensitive resin composition, as disclosed in, for example, Japanese Examined Patent Application, Publication No. H6-12452 and the like, an organic or inorganic antireflective film may also be preformed on the substrate employed. Moreover, in order to avoid the influence of basic impurities and the like contained in an environmental atmosphere, a protective film may be provided on the resist coating film, as disclosed in, for example, Japanese Unexamined Patent Application, Publication No. H5-188598 and the like. Of course, these techniques may be employed in conjunction with each other.

Step (2)

In the step (2), the resist coating film formed in the step (1) is exposed. The acid-dissociable group in the polymer component (A) is dissociated by the action of the acid generated from the acid generating agent (B) upon the exposure, to generate a carboxyl group. The generation of the carboxyl group leads to the increase in the solubility of the resist coating film in an alkaline developer solution at light-exposed sites. The radioactive ray employed for the exposure may be appropriately selected from visible light rays, ultraviolet rays, far ultraviolet rays, X-rays, charged particle rays and the like. The radioactive ray is preferably a far ultraviolet ray, more preferably an ArF excimer laser beam (wavelength: 193 nm), and a KrF excimer laser beam (wavelength: 248 nm), and is particularly preferably an ArF excimer laser beam.

Step (3)

In the step (3), the resist coating film exposed in the step (2) is heated. More specifically, post exposure baking (PEB) is carried out. The PEB allows the dissociation reaction of the acid-dissociable group in the resist coating film to smoothly proceed. The PEB temperature is preferably below 100° C., more preferably no greater than 96° C., still more preferably no greater than 91° C., and particularly preferably no greater than 86° C. In addition, the PEB temperature is preferably no less than 30° C., and more preferably no less than 50° C. When the PEB temperature is set in the foregoing range, diffusion length of the acid generated from the acid generating agent (B) and the like can be moderately shorten as a synergic effect with an acid diffusion controlling effect of the compound (C). As a result, the LWR and limit dimension for pattern collapse of the resist pattern formed can be lowered, while the amount of residual resist film can be increased. The PEB time is preferably 5 sec to 600 sec, and more preferably 10 sec to 300 sec.

Step (4)

In the step (4), the resist coating film heated in the step (3) is developed. More specifically, a positive type resist pattern can be formed by dissolving light-exposed sites of the exposed resist coating film in an alkaline developer solution and removing the same. In addition, after the development with the developer solution, washing with water followed by drying is preferably conducted.

The developer solution is preferably an aqueous alkaline solution obtained by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8- diazabicyclo[5.4.0]-7-undecene and 1,5-diazabicyclo[4.3.0]-5-nonene, and the like. The concentration of the aqueous alkaline solution is preferably no greater than 10% by mass. When the concentration of the aqueous alkaline solution exceeds 10% by mass, even light-unexposed sites also tend to be dissolved in the developer solution.

In addition, the developer solution may contain, for example, an organic solvent. Examples of the organic solvent include ketones such as acetone, methyl ethyl ketone, methyl i-butyl ketone, cyclopentanone, cyclohexanone, 3-methylcyclopentanone, and 2,6-dimethylcyclohexanone; alcohols such as methyl alcohol, ethyl alcohol, n-propyl alcohol, i-propyl alcohol, n-butyl alcohol, t-butyl alcohol, cyclopentanol, cyclohexanol, 1,4-hexanediol, and 1,4-hexanedimethylol; ethers such as tetrahydrofuran, and dioxane; esters such as ethyl acetate, n-butyl acetate, and i-amyl acetate; aromatic hydrocarbons such as toluene, and xylene; phenol, acetonylacetone, and dimethyl formamide; and the like. These organic solvents may be used alone, or in combination of two or more thereof.

The content of the organic solvent is preferably no greater than 100 volume % with respect to the aqueous alkaline solution. When the content of the organic solvent exceeds 100 volume %, developability tend to be deteriorated, and developmental residues of the light-exposed site tend to be increased. Moreover, a appropriate amount of the surfactant as described above, and the like may be added to the developer solution.

Polymer

The polymer according to the embodiment of the present invention is one having the structural unit (I) represented by the above formula (1), the structural unit (II) represented by the above formula (2) and the structural unit (IV) having a cyclic carbonate structure. Since the polymer has the respective structural units and the above-described characteristics, the polymer may be suitably used as a component of the radiation-sensitive resin composition, and has a positive effect on properties such as the LWR feature, the limit dimension for pattern collapse and the amount of residual resist film as well as the adhesiveness of the resist pattern to a substrate.

The proportion of the structural unit (IV) including a cyclic carbonate structure in the polymer is typically no greater than 70 mol %, preferably 10 mol % to 65 mol %, more preferably 10 mol % to 50 mol %, and still more preferably 10 mol % to 35 mol % with respect to the total structural units in the polymer.

Detailed explanation of the polymer will be omitted here, since the detailed explanation thereof is already given in the section of the polymer component (A) contained in the radiation-sensitive resin composition.

EXAMPLES

Hereinafter, the present invention will be explained more specifically by way of Examples, but the present invention is not limited to these Examples. Measuring method of each physical property value is as follows.

Mw and Mn of Polymer Component

Mw and Mn of the polymer component were determined using gel permeation chromatography (GPC) using GPC columns (manufactured by Tosoh Corporation, G2000HXL×2, G3000HXL×1, G4000HXL×1) under an analytical condition involving a flow rate of 1.0 mL/min, an elution solvent of tetrahydrofuran, a column temperature of 40° C., with monodisperse polystyrenes as a standard.

$^{13}$C-NMR Analysis:

$^{13}$C-NMR analysis of the polymers was carried out using a nuclear magnetic resonance apparatus (JNM-ECX400, manufactured by JEOL, Ltd.).

Synthesis of Polymer

Monomers used in the synthesis of the polymer component (A) and the fluorine atom-containing polymer (E) are shown below.

Each structure formula is shown below:
M-1: 1-methylcyclopentyl methacrylate
M-2: 1-ethylcyclopentyl methacrylate
M-3: 1-isopropyladamantyl methacrylate
M-4: 1-ethyladamantyl methacrylate
M-5: 1-methyladamantyl methacrylate
M-6: 2-oxo-1,3-dioxolan-4-yl methacrylate
M-7: 4-oxa-5-oxotricyclo[4,2,1,0$^{3,7}$]nonan-2-yl methacrylate
M-8: 1-methoxycarbonyl-1,1-difluoro-2-butyl methacrylate

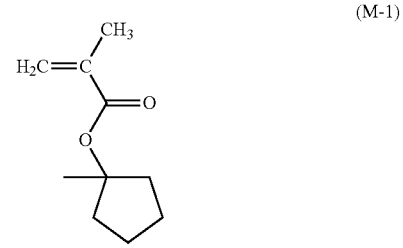
(M-1)

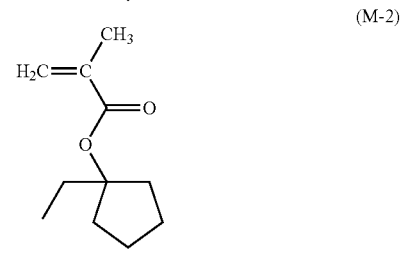
(M-2)

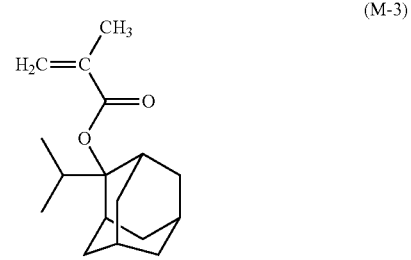
(M-3)

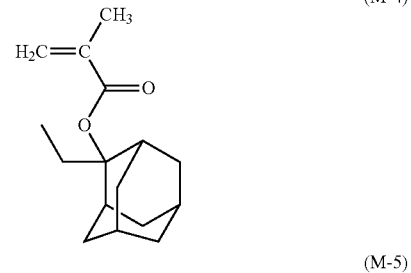
(M-4)

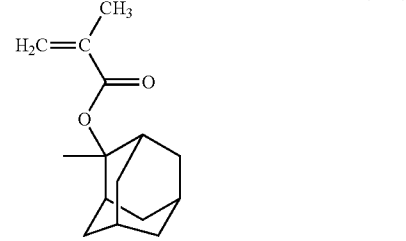
(M-5)

-continued

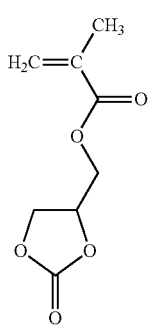

(M-6)

(M-7)

(M-8)

Synthesis of Polymer Constituting Polymer Component (A)

Synthesis Example 1

Synthesis of Polymer (A-1)

A monomer solution was prepared by dissolving 37.49 g (45 mol %) of the monomer (M-1) and 49.52 g (45 mol %) of the monomer (M-7) in 200 g of 2-butanone, and further dissolving 1.63 g (2 mol % with respect to the total mol number of the monomers) of AIBN as an initiator.

Then, into a 1,000 mL three-neck flask equipped with a thermometer and a dropping funnel were placed 100 g of 2-butanone and 12.99 g (10 mol %) of the monomer (M-3), and then nitrogen was purged for 30 min. After purging with nitrogen, the content inside the flask was heated to 80° C. while stirring with a magnetic stirrer. The monomer solution prepared above was added dropwise via a dropping funnel over 3 hrs. The time of the start of the dropwise addition was considered to be the time of the initiation of the polymerization, and the polymerization reaction was allowed to proceed for 6 hrs. After completing the polymerization, the polymerization solution was cooled to no greater than 30° C. via water-cooling. After cooling, the polymerization solution was charged into 2,000 g of methanol, a white powder precipitated was filtered off. The filtered white powder was washed twice by slurrying the white powder in 400 g of methanol. Thereafter, the white powder was filtered off, and dried at 60° C. for 18 hrs, to obtain the polymer (A-1) as a white powder (80.3 g; yield: 80%). The polymer (A-1) had an Mw of 11,500, and an Mw/Mn of 1.47. In addition, the result of $^{13}$C-NMR analysis indicated that the ratio of the structural unit derived from (M-1):the structural unit derived from (M-3):the structural unit derived from (M-7) was 44.5:8.5:47.0 (mol %).

Synthesis Example 2

Synthesis of Polymer (A-2)

The polymer (A-2) was obtained as a white powder (81.8 g; yield: 82%) in a similar manner to Synthesis Example 1, except that 100 g of 2-butanone and 12.81 g (10 mol %) of the monomer (M-3) were placed into a three-neck flask, and a solution obtained by dissolving 20.54 g (25 mol %) of the monomer (M-1), 17.80 g (20 mol %) of the monomer (M-2), 48.84 g (45 mol %) of the monomer (M-7) and 1.60 g (2 mol %) of AIBN in 100 g of 2-butanone was used as a monomer solution to be added dropwise. The polymer (A-2) had an Mw of 11,200, an Mw/Mn of 1.41. In addition, the result of $^{13}$C-NMR analysis indicated that the ratio of the structural unit derived from (M-1):the structural unit derived from (M-2):the structural unit derived from (M-3):the structural unit derived from (M-7) was 24.2:19.1:8.7:48.0 (mol %).

Synthesis Example 3

Synthesis of Polymer (A-3)

The polymer (A-3) was obtained as a white powder (79.1 g; yield: 79%) in a similar manner to Synthesis Example 1, except that 100 g of 2-butanone and 12.72 g (10 mol %) of the monomer (M-3) were placed into a three-neck flask, and a solution obtained by dissolving 44.18 g (50 mol %) of the monomer (M-2), 43.10 g (40 mol %) of the monomer (M-7) and 1.59 g (2 mol %) of AIBN in 100 g of 2-butanone was used as a monomer solution to be added dropwise. The polymer (A-3) had an Mw of 11,800, and an Mw/Mn of 1.49. In addition, the result of $^{13}$C-NMR analysis indicated that the ratio of the structural unit derived from (M-2):the structural unit derived from (M-3):the structural unit derived from (M-7) was 49.1:8.3:42.6 (mol %).

Example 1

Synthesis of Polymer (A-4)

The polymer (A-4) was obtained as a white powder (78.9 g; yield: 79%) in a similar manner to Synthesis Example 1, except that 100 g of 2-butanone and 13.47 g (10 mol %) of the monomer (M-3) were placed into a three-neck flask, and a solution obtained by dissolving 38.88 g (45 mol %) of the monomer (M-1), 19.12 g (20 mol %) of the monomer (M-6), 28.53 g (25 mol %) of the monomer (M-7) and 1.69 g (2 mol %) of AIBN in 100 g of 2-butanone was used as a monomer solution to be added dropwise. The polymer (A-4) had an Mw of 11,000, and an Mw/Mn of 1.40. In addition, the result of $^{13}$C-NMR analysis indicated that the ratio of the structural unit derived from (M-1):the structural unit derived from (M-3):the structural unit derived from (M-6):the structural unit derived from (M-7) was 43.9:8.3:19.8:28.0 (mol %).

Example 2

Synthesis of Polymer (A-5)

The polymer (A-5) was obtained as a white powder (76.7 g; yield: 77%) in a similar manner to Synthesis Example 1, except that 100 g of 2-butanone and 13.18 g (10 mol %) of the monomer (M-3) were placed into a three-neck flask, and a solution obtained by dissolving 45.78 g (50 mol %) of the monomer (M-2), 18.70 g (20 mol %) of the monomer (M-6), 22.33 g (20 mol %) of the monomer (M-7) and 1.65 g (2 mol %) of AIBN in 100 g of 2-butanone was used as a monomer solution to be added dropwise. The polymer (A-5) had an Mw of 11,800, and an Mw/Mn of 1.48. In addition, the result of $^{13}$C-NMR analysis indicated that the ratio of the structural unit derived from (M-2):the structural unit derived from (M-3):the structural unit derived from (M-6):the structural unit derived from (M-7) was 43.9:8.3:19.8:28.0 (mol %).

Synthesis Example 4

Synthesis of Polymer (A-6)

The polymer (A-6) was obtained as a white powder (80.4 g; yield: 80%) in a similar manner to Synthesis Example 1, except that 100 g of 2-butanone was placed into a three-neck flask, and a solution obtained by dissolving 43.08 g (50 mol %) of the monomer (M-1), 56.92 g (50 mol %) of the monomer (M-7) and 1.68 g (2 mol %) of AIBN in 100 g of 2-butanone was used as a monomer solution to be added dropwise. The polymer (A-6) had an Mw of 12,100, and an Mw/Mn of 1.53. In addition, the result of $^{13}$C-NMR analysis indicated that the ratio of the structural unit derived from (M-1):the structural unit derived from (M-7) was 49.6:50.4 (mol %).

Synthesis Example 5

Synthesis of Polymer (A-7)

The polymer (A-7) was obtained as a white powder (74.2 g; yield: 74%) in a similar manner to Synthesis Example 1, except that 100 g of 2-butanone and 63.91 g (60 mol %) of the monomer (M-3) were placed into a three-neck flask, and a solution obtained by dissolving 36.09 g (40 mol %) of the monomer (M-7) and 1.33 g (2 mol %) of AIBN in 100 g of 2-butanone was used as a monomer solution to be added dropwise. The polymer (A-7) had an Mw of 10,200, and an Mw/Mn of 1.45. In addition, the result of $^{13}$C-NMR analysis indicated that the ratio of the structural unit derived from (M-3):the structural unit derived from (M-7) was 48.5:51.5 (mol %).

Synthesis Example 6

Synthesis of Polymer (A-8)

The polymer (A-8) was obtained as a white powder (82.3 g; yield: 82%) in a similar manner to Synthesis Example 1, except that 100 g of 2-butanone and 12.38 g (10 mol %) of the monomer (M-4) were placed into a three-neck flask, and a solution obtained by dissolving 37.75 g (45 mol %) of the monomer (M-1), 49.87 g (45 mol %) of the monomer (M-7) and 1.64 g (2 mol %) of AIBN in 100 g of 2-butanone was used as a monomer solution to be added dropwise. The polymer (A-8) had an Mw of 12,000, and an Mw/Mn of 1.47. In addition, the result of $^{13}$C-NMR analysis indicated that the ratio of the structural unit derived from (M-1):the structural unit derived from (M-4):the structural unit derived from (M-7) was 44.5:8.9:46.6 (mol %).

Synthesis Example 7

Synthesis of Polymer (A-9)

The polymer (A-9) was obtained as a white powder (79.8 g; yield: 80%) in a similar manner to Synthesis Example 1, except that 100 g of 2-butanone and 12.12 g (10 mol %) of the monomer (M-4) were placed into a three-neck flask, and a solution obtained by dissolving 44.48 g (50 mol %) of the monomer (M-2), 43.39 g (40 mol %) of the monomer (M-7) and 1.60 g (2 mol %) of AIBN in 100 g of 2-butanone was used as a monomer solution to be added dropwise. The polymer (A-9) had an Mw of 11,200, and an Mw/Mn of 1.43. In addition, the result of $^{13}$C-NMR analysis indicated that the ratio of the structural unit derived from (M-2):the structural unit derived from (M-4):the structural unit derived from (M-7) was 48.7:8.8:42.5 (mol %).

Synthesis of Fluorine Atom-Containing Polymer (E)

Synthesis Example 8

Synthesis of Fluorine Atom-Containing Polymer (E-1)

A monomer solution was prepared by dissolving 24.85 g (30 mol %) of the monomer (M-2), 75.15 g (70 mol %) of the monomer (M-8) in 100 g of 2-butanone, and further dissolving 2.05 g (7 mol %) of AIBN as an initiator.

Then, into a 1,000 mL three-neck flask equipped with a thermometer and a dropping funnel was charged 50 g of 2-butanone, and nitrogen was purged for 30 min. After purging with nitrogen, the content inside the flask was heated to 80° C. with stirring with a magnetic stirrer. The monomer solution prepared above was added dropwise via a dropping funnel over 3 hrs. The time of the start of the dropwise addition was considered to be the time of the initiation of the polymerization, and the polymerization reaction was allowed to proceed for 6 hrs. After completing the polymerization, the polymerization solution was cooled to no greater than 30° C. via water-cooling. After cooling, the content of the flask was concentrated to 150 g, and charged into a mixed solution of 1,125 g of methanol and 125 g of water, and the precipitates precipitated were recovered. Thereafter, the solvent was replaced by propylene glycol monomethyl ether acetate, to obtain a 20% by mass solution of the fluorine atom-containing polymer (E-1) in propylene glycol monomethyl ether acetate (350.2 g; yield: 70%). The fluorine atom-containing polymer (E-1) had an Mw of 11,100, and an Mw/Mn of 1.52. In addition, the result of $^{13}$C-NMR analysis indicated that the ratio of the structural unit derived from (M-2):the structural unit derived from (M-8) was 29.8:70.2 (mol %).

Preparation of Radiation-Sensitive Resin Composition

Other components than the polymer component (A) and the fluorine atom-containing polymer (E) used in the preparation of the radiation-sensitive resin composition are shown below.

Acid Generating Agent (B)

The structure formulae of the respective acid generating agents is shown below:

B-1: 4-cyclohexylphenyldiphenylsulfonium nonafluoro-n-butane-1-sulfonate

B-2: triphenylsulfonium 2-(adamantan-1-yl)-1,1-difluoroethane-1-sulfonate

B-3: triphenylsulfonium 2-bicyclo[2.2.1]hepta-2-yl-1,1,2,2-tetrafluoroethane-1-sulfonate.

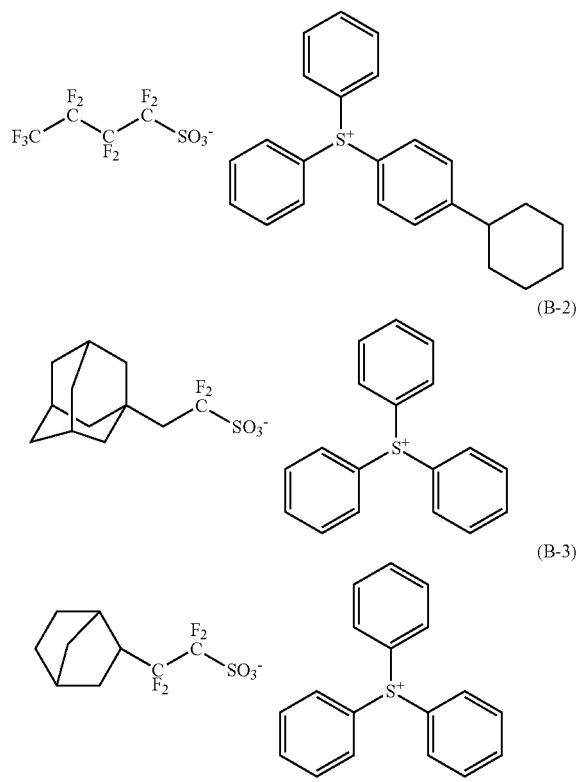

Component (C)
C-1: 2,6-diisopropylaniline
C-2: N-t-amyloxycarbonyl-4-hydroxypiperidine
CC-1: tri-n-pentylamine
CC-2: diethanolamine
Solvent (D)
D-1: propylene glycol monomethyl ether acetate
D-2: cyclohexanone
D-3: γ-butyrolactone

Example 3

A radiation-sensitive resin composition (J-1) was prepared by mixing 100 parts by mass of (A-1) as the polymer component (A), 4 parts by mass of (B-1), 4 parts by mass of (B-2) and 4 parts by mass of (B-3) as the acid generating agent (B), 1 part by mass of (C-1) as the compound (C), 2,600 parts by mass of (D-1), 1,100 parts by mass of (D-2) and 15 parts by mass of (D-3) as the solvent (D), and 7 parts by mass of (E-1) as the fluorine atom-containing polymer (E), and filtering the mixture through a filter with a pore size of 0.20 μm.

Examples 4 to 11 and Comparative Examples 1 to 6

The radiation-sensitive resin composition (J-2) to (J-9) and (CJ-1) to (CJ-6) according to the respective Examples and Comparative Examples were prepared in a similar manner to Example 3, except that the respective components of the type and blend amount set forth in Table 1 below were used. The symbol "-" in Table 1 means that the corresponding component was not used.

TABLE 1

| | Radiation-sensitive resin composition | (A) Polymer component Type | Blend amount (parts by mass) | (B) Acid generating agent Type | Blend amount (parts by mass) | (C) Compound Type | Blend amount (parts by mass) | (D) Solvent Type | Blend amount (parts by mass) | (E) Fluorine atom-containing polymer Type | Blend amount (parts by mass) |
|---|---|---|---|---|---|---|---|---|---|---|---|
| Example 3 | J-1 | A-1 | 100 | B-1/B-2/B-3 | 4/4/4 | C-1 | 1 | D-1/D-2/D-3 | 2,600/1,100/15 | E-1 | 7 |
| Example 4 | J-2 | A-1 | 100 | B-1/B-2/B-3 | 4/4/4 | C-1 | 1 | D-1/D-2/D-3 | 2,600/1,100/15 | — | — |
| Example 5 | J-3 | A-2 | 100 | B-1/B-2/B-3 | 4/4/4 | C-1 | 1 | D-1/D-2/D-3 | 2,600/1,100/15 | E-1 | 5 |
| Example 6 | J-4 | A-3 | 100 | B-1/B-2 | 6/6 | C-1/C-2 | 0.5/0.5 | D-1/D-2/D-3 | 2,600/1,100/15 | E-1 | 5 |
| Example 7 | J-5 | A-4 | 100 | B-1/B-2/B-3 | 4/4/4 | C-1 | 1 | D-1/D-2/D-3 | 2,600/1,100/15 | E-1 | 7 |
| Example 8 | J-6 | A-5 | 100 | B-1/B-2 | 6/6 | C-1/C-2 | 0.5/0.5 | D-1/D-2/D-3 | 2,600/1,100/15 | E-1 | 5 |
| Example 9 | J-7 | A-6/A-7 | 80/20 | B-1/B-2/B-3 | 4/4/4 | C-1 | 1 | D-1/D-2/D-3 | 2,600/1,100/15 | E-1 | 7 |
| Example 10 | J-8 | A-1 | 100 | B-1/B-2/B-3 | 4/4/4 | C-2 | 1 | D-1/D-2/D-3 | 2,600/1,100/15 | E-1 | 7 |
| Example 11 | J-9 | A-3 | 100 | B-1/B-2/B-3 | 4/4/4 | C-2 | 1 | D-1/D-2/D-3 | 2,600/1,100/15 | E-1 | 7 |
| Comparative Example 1 | CJ-1 | A-8 | 100 | B-1/B-2/B-3 | 4/4/4 | C-1 | 1 | D-1/D-2/D-3 | 2,600/1,100/15 | E-1 | 7 |
| Comparative Example 2 | CJ-2 | A-8 | 100 | B-1/B-2/B-3 | 4/4/4 | C-1 | 1 | D-1/D-2/D-3 | 2,600/1,100/15 | E-1 | 7 |
| Comparative Example 3 | CJ-3 | A-9 | 100 | B-1/B-2 | 6/6 | C-1/C-2 | 0.5/0.5 | D-1/D-2/D-3 | 2,600/1,100/15 | E-1 | 5 |
| Comparative Example 4 | CJ-4 | A-9 | 100 | B-1/B-2 | 6/6 | C-1/C-2 | 0.5/0.5 | D-1/D-2/D-3 | 2,600/1,100/15 | E-1 | 5 |
| Comparative Example 5 | CJ-5 | A-1 | 100 | B-1/B-2/B-3 | 4/4/4 | CC-1 | 1 | D-1/D-2/D-3 | 2,600/1,100/15 | E-1 | 7 |
| Comparative Example 6 | CJ-6 | A-1 | 100 | B-1/B-2/B-3 | 4/4/4 | CC-2 | 1 | D-1/D-2/D-3 | 2,600/1,100/15 | E-1 | 7 |

Formation of Resist Pattern

Resist patterns were formed using the radiation-sensitive resin composition of Examples and Comparative Examples prepared above, and the pattern-forming methods specified in Table 2.

Pattern-Forming Method 1

Examples 3 and 5 to 11 and Comparative Examples 1 to 6

A silicon wafer having a two-layered resist underlayer film composed of a film of CTL53 (manufactured by JSR) with a film thickness of 230 nm and a film of SOG508 (manufactured by JSR) with a film thickness of 45 nm formed on a surface thereof was used as a substrate. The radiation-sensitive resin composition was coated on the substrate by spin coating, and thereafter PB was carried out on a hot plate at 110° C. for 60 sec, to provide a resist coating film with a film thickness of 100 nm. The resist coating film was exposed through a mask pattern using ArF excimer laser Immersion Scanner (S610C, manufactured by Nikon Corporation (numerical aperture: 1.30)). Thereafter, PEB was carried out at the PEB temperature specified in Table 2 for 60 sec, and then the exposed resist coating film was developed at 23° C. for 4 sec with a 2.38% by mass aqueous tetramethylammonium hydroxide solution, washed with water, and dried, to form a positive type resist pattern.

Pattern-Forming Method 2

Example 4

Similarly to the pattern-forming method 1 as described above, a two-layered resist underlayer film and a resist coating film were formed on a surface of a silicon wafer, and then TCX091 (manufactured by JSR) was spin coated on the formed resist coating film as a liquid immersion upperlayer film, and the silicon wafer was heated at 90° C. for 60 sec to form a coated film with a film thickness of 90 nm. Subsequently, the film was exposed through a mask pattern using the ArF excimer laser Immersion Scanner. Thereafter, PEB was carried out at 95° C. for 60 sec, and then development was carried out with a 2.38% by mass aqueous tetramethylammonium hydroxide solution at 23° C. for 4 sec, washed with water, and dried, to form a positive type resist pattern.

Evaluation

The resist patterns thus formed were evaluated in accordance with the following methods. The evaluation results are shown in Table 2 below.

Optimum Exposure Dose

Among the exposure doses giving the resist patterns, an exposure dose that results in the formation of an intended 1:1 line-and-space pattern (1L/1S) with a line width of 40 nm in the resultant resist patterns was defined as an optimum exposure dose.

[LWR]

With respect to a 40 nm 1L/1S pattern resolved at the optimal exposure dose, line widths at arbitrary ten points were measured when observed from above the pattern using a SEM for critical dimension measurement (CG4000 manufactured by Hitachi, Ltd.), and the degree of distribution of measurements expressed as a value in terms of the 3 Sigma was defined as "LWR (nm)".

Limit Dimension for Pattern Collapse

Exposure was carried out using a mask pattern for forming a 40 nm 1L/1S pattern, while changing an exposure dose from the optimum exposure dose by a step of 1 mJ. For each exposure shot, 20 photographs of the 40 nm 1L/1S pattern formed were taken using the SEM for critical dimension measurement, and the pattern line width in the exposure shot having the minimum pattern line width among the exposure shots leading to no collapsed pattern was determined as "limit dimension for pattern collapse (nm)".

Amount of Residual Resist Film

A cross-sectional shape of a 40 nm 1L/1S pattern resolved at the optimal exposure dose was observed using a cross sectional SEM (S4800, manufactured by Hitachi, Ltd.), and the height of the pattern measured was defined as "amount of residual resist film (nm)".

TABLE 2

| | Radiation-sensitive resin composition | Pattern forming-method | PEB temperature (° C.) | Evaluation result | | |
|---|---|---|---|---|---|---|
| | | | | LWR (nm) | Limit dimension for pattern collapse (nm) | Amount of residual resist film (nm) |
| Example 3 | J-1 | 1 | 95 | 4.2 | 30 | 86 |
| Example 4 | J-2 | 2 | 95 | 4.2 | 29 | 87 |
| Example 5 | J-3 | 1 | 95 | 4.2 | 29 | 86 |
| Example 6 | J-4 | 1 | 90 | 4.0 | 28 | 84 |
| Example 7 | J-5 | 1 | 90 | 4.1 | 30 | 88 |
| Example 8 | J-6 | 1 | 85 | 3.9 | 31 | 86 |
| Example 9 | J-7 | 1 | 95 | 4.2 | 30 | 85 |
| Example 10 | J-8 | 1 | 95 | 4.1 | 31 | 88 |
| Example 11 | J-9 | 1 | 90 | 4.1 | 31 | 86 |
| Comparative Example 1 | CJ-1 | 1 | 95 | 4.3 | 34 | 78 |
| Comparative Example 2 | CJ-2 | 1 | 100 | 4.7 | 30 | 74 |
| Comparative Example 3 | CJ-3 | 1 | 95 | 4.2 | 33 | 77 |
| Comparative Example 4 | CJ-4 | 1 | 100 | 4.4 | 30 | 73 |
| Comparative Example 5 | CJ-5 | 1 | 95 | 4.1 | 38 | 86 |
| Comparative Example 6 | CJ-6 | 1 | 95 | 4.2 | 37 | 85 |

As shown in Table 2, it is believed that the radiation-sensitive resin composition according to an aspect of the embodiments of the present invention is likely to undergo a more sufficient deprotection reaction of the acid-dissociable group at lower PEB temperatures as compared to the radiation-sensitive resin compositions according to Comparative Examples, and use of the compound (C) is likely to enable the diffusion length of the acid to be minimized; therefore, a resist pattern exhibiting excellent LWR features, as well as a low limit dimension for pattern collapse and a large amount of residual resist film can be consequently formed.

According to the embodiment of the present invention, a radiation-sensitive resin composition exhibiting excellent LWR feature, as well as a low limit dimension for pattern collapse and a large amount of residual resist film can be provided. Therefore, the radiation-sensitive resin composition can be suitably used for chemically amplified type resists in use for the production of semiconductor devices and the like, which require microfabrication with increasing severity in future.

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation-sensitive resin composition comprising:
a polymer component comprising, in an identical polymer or different polymers, a first structural unit represented by a formula (1) and a second structural unit represented by a formula (2);
a radiation-sensitive acid generating agent; and
a nitrogen-containing compound comprising a ring structure,

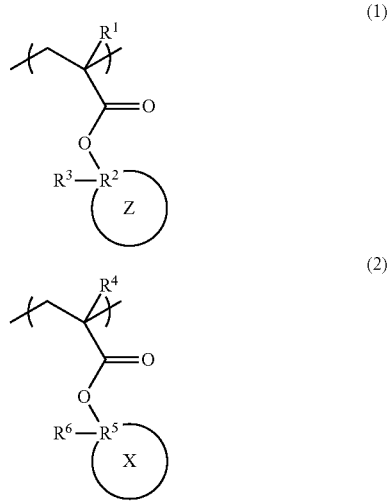

wherein, in the formula (1), $R^1$ represents a hydrogen atom or a methyl group; Z is a group which represents a divalent monocyclic alicyclic hydrocarbon group taken together with $R^2$; $R^2$ represents a carbon atom; and $R^3$ represents a methyl group or an ethyl group, and in the formula (2), $R^4$ represents a hydrogen atom or a methyl group; X is a group which represents a divalent bridged alicyclic hydrocarbon group having no less than 10 carbon atoms taken together with $R^5$; $R^5$ represents a carbon atom; and $R^6$ represents a branched alkyl group having 3 or 4 carbon atoms.

2. The radiation-sensitive resin composition according to claim 1, wherein the polymer component comprises a polymer comprising the first structural unit and the second structural unit.

3. The radiation-sensitive resin composition according to claim 1, wherein the polymer component is a mixture comprising: a polymer comprising the first structural unit and a polymer comprising the second structural unit.

4. The radiation-sensitive resin composition according to claim 1, wherein the first structural unit is represented by a formula (1-1):

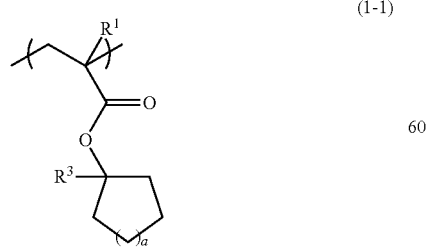

wherein, in the formula (1-1), $R^1$ and $R^3$ are as defined in the formula (1); and a is 1 or 2.

5. The radiation-sensitive resin composition according to claim 1, wherein the second structural unit is represented by a formula (2-1):

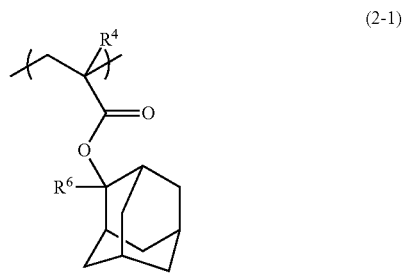

wherein, in the formula (2-1), $R^4$ and $R^6$ are as defined in the formula (2).

6. The radiation-sensitive resin composition according to claim 1, wherein the polymer component further comprises, in an identical polymer or different polymers, a third structural unit comprising a lactone skeleton, a fourth structural unit comprising a cyclic carbonate structure or both of the third structural unit and the fourth structural unit.

7. The radiation-sensitive resin composition according to claim 1, wherein the nitrogen-containing compound comprises an aromatic ring structure, a nitrogen atom-containing heterocyclic structure or both of the aromatic ring structure and the nitrogen atom-containing heterocyclic structure.

8. A polymer comprising a first structural unit represented a formula (1), a second structural unit represented a formula (2) and a structural unit comprising a cyclic carbonate structure:

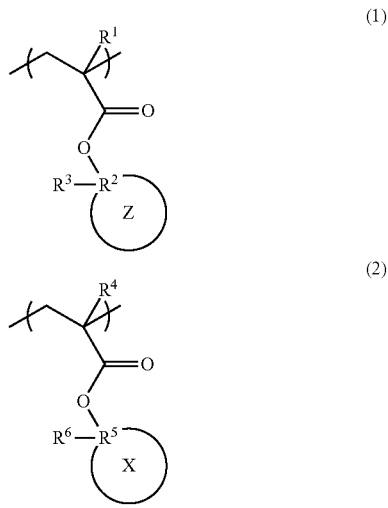

wherein, in the formula (1), $R^1$ represents a hydrogen atom or a methyl group; Z is a group which represents a divalent monocyclic alicyclic hydrocarbon group taken together with $R^2$; $R^2$ represents a carbon atom; and $R^3$ represents a methyl group or an ethyl group, and in the formula (2), $R^4$ represents a hydrogen atom or a methyl group; X is a group which represents a divalent bridged alicyclic hydrocarbon group having no less than 10 carbon atoms taken together with $R^5$; $R^5$ represents a carbon atom; and $R^6$ represents a branched alkyl group having 3 or 4 carbon atoms.

9. A resist pattern-forming method comprising:
coating the radiation-sensitive resin composition according to claim 1 on a substrate to provide a resist coating film,
exposing the resist coating film,
heating the exposed resist coating film, and
developing the heated resist coating film.

* * * * *